(12) United States Patent
Kuang et al.

(10) Patent No.: US 11,568,819 B2
(45) Date of Patent: Jan. 31, 2023

(54) PIXEL DRIVING CIRCUIT AND METHOD FOR DRIVING THE SAME, DISPLAY PANEL, AND DISPLAY DEVICE

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventors: Jian Kuang, Wuhan (CN); Xingyao Zhou, Wuhan (CN); Yana Gao, Wuhan (CN); Mengmeng Zhang, Wuhan (CN); Gaojun Huang, Shanghai (CN)

(73) Assignees: WUHAN TIANMA MICROELECTRONICS CO., LTD., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 17/857,611

(22) Filed: Jul. 5, 2022

(65) Prior Publication Data
US 2022/0335896 A1 Oct. 20, 2022

(30) Foreign Application Priority Data
Mar. 31, 2022 (CN) .......................... 202210337848.8

(51) Int. Cl.
*G09G 3/3258* (2016.01)
*G09G 3/3291* (2016.01)

(52) U.S. Cl.
CPC ......... *G09G 3/3258* (2013.01); *G09G 3/3291* (2013.01); *G09G 2310/061* (2013.01)

(58) Field of Classification Search
CPC .. G09G 3/3233; G09G 3/3266; G09G 3/2927; G09G 3/3291; G09G 3/3258;
(Continued)

(56) References Cited

U.S. PATENT DOCUMENTS 11,049,458 B1 * 6/2021 Fan ...................... G09G 3/3266
2017/0031485 A1 * 2/2017 Kim ..................... G06F 3/04184

FOREIGN PATENT DOCUMENTS

| CN | 106782304 A | 5/2017 |
| CN | 113450717 A | 9/2021 |

* cited by examiner

*Primary Examiner* — Dong Hui Liang
(74) *Attorney, Agent, or Firm* — Christensen O'Connor Johnson Kindness PLLC

(57) ABSTRACT

A pixel driving circuit, a method for driving the same and a display panel are provided. In an embodiment, the pixel driving circuit includes: a driving circuit; a light-emitting circuit including a first electrode and a first reset circuit. In an embodiment, a working timing sequence of the pixel driving circuit includes working periods, one of which includes first and second light-emitting stages. In an embodiment, the first and second light-emitting stages each include a reset stage and a light-emitting stage, wherein, during the reset stage of the first light-emitting stage, the first reset circuit transmits a first reset voltage to the first electrode of the light-emitting circuit and during the reset stage of the second light-emitting stage, the first reset circuit transmits a modification reset voltage to the first electrode of the light-emitting circuit, the modification reset voltage being different from the first reset voltage.

20 Claims, 19 Drawing Sheets

(58) Field of Classification Search
CPC ... G09G 2300/0819; G09G 2300/0861; G09G 2300/0852; G09G 2300/0866; G09G 2320/043; G09G 2320/0233; G09G 2320/045; G09G 2310/066

See application file for complete search history.

During a reset stage of a first light-emitting stage, transmitting, by a first reset module, a first reset voltage to a first electrode of a light-emitting module

During a reset stage of a second light-emitting stage, transmitting, by the first reset module, a modification reset voltage different from the first reset voltage to the first electrode of the light-emitting module

FIG. 15

PIXEL DRIVING CIRCUIT AND METHOD FOR DRIVING THE SAME, DISPLAY PANEL, AND DISPLAY DEVICE

CROSS-REFERENCE TO RELATED DISCLOSURE

The present disclosure claims priority to Chinese Patent Disclosure No. 202210337848.8, filed on Mar. 31, 2022, the content of which is incorporated herein by reference in its entirety.

TECHNICAL FIELD

The present disclosure relates to the field of display technologies, and, in particular, to a pixel driving circuit and a method for driving the same, a display panel, and a display device.

BACKGROUND

An organic light-emitting diode (OLED) display panel has the advantages of low power consumption, self-illumination, wide viewing angle, wide temperature characteristics, and fast response speed, and is widely used in the market. The pixel driving circuit configured to control the light-emitting device to emit light is the core technology of the OLED display panel and has important research significance.

In the pixel driving circuit in the related art, due to the operating characteristics of the driving transistors, the light-emitting brightness of the display panel during a first light-emitting stage and the light-emitting brightness of the display panel during a second light-emitting stage are quite different, which affects the display effect. The first light-emitting stage refers to a stage including a data voltage writing stage and a light-emitting stage, and the second light-emitting stage is a stage after the first light-emitting stage and does not include a data voltage writing stage but includes a light-emitting stage. The display effect is deleteriously affected in a low-grayscale and low-frequency display state of the display panel.

SUMMARY

In a first aspect, some embodiments of the present disclosure provide a pixel driving circuit. In an embodiment, the pixel driving circuit includes: a driving circuit configured to generate a light-emitting driving current; a light-emitting circuit including a first electrode configured to receive the light-emitting driving current generated by the driving circuit; and a first reset circuit including an output terminal electrically connected to the first electrode of the light-emitting circuit. In an embodiment, a working timing sequence of the pixel driving circuit includes a plurality of working periods, each of which includes a first light-emitting stage and a second light-emitting stage after the first light-emitting stage. In an embodiment, the first light-emitting stage includes a reset stage and a light-emitting stage after the reset stage; and during the reset stage of the first light-emitting stage, the first reset circuit transmits a first reset voltage to the first electrode of the light-emitting circuit. In an embodiment, the second light-emitting stage includes a reset stage and a light-emitting stage after the reset stage; and during the reset stage of the second light-emitting stage, the first reset circuit transmits a modification reset voltage to the first electrode of the light-emitting circuit, the modification reset voltage being different from the first reset voltage.

In a second aspect, some embodiments of the present disclosure provide a method for driving a pixel driving circuit. In an embodiment, the pixel driving circuit includes: a driving circuit configured to generate a light-emitting driving current; a light-emitting circuit including a first electrode configured to receive the light-emitting driving current generated by the driving circuit; and a first reset circuit including an output terminal electrically connected to the first electrode of the light-emitting circuit. In an embodiment, a working timing sequence of the pixel driving circuit includes a plurality of working periods, each of which includes a first light-emitting stage and a second light-emitting stage after the first light-emitting stage. In an embodiment, the method includes: during a reset stage of the first light-emitting stage, transmitting, by the first reset circuit, a first reset voltage to the first electrode of the light-emitting circuit; and during a reset stage of the second light-emitting stage, transmitting, by the first reset circuit, a modification reset voltage different from the first reset voltage to the first electrode of the light-emitting circuit.

In a third aspect, some embodiments of the present disclosure provide a display panel. The display panel includes the display pixel driving circuit described in the first aspect.

In a fourth aspect, some embodiments of the present disclosure provide a display device. The display device includes the display panel described in the third aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

FIG. 15 is a flowchart of a method for driving a pixel driving circuit provided by some embodiments of the disclosure;

DESCRIPTION OF EMBODIMENTS

In order to better illustrate the technical solutions of the present disclosure, the embodiments of the present disclosure are described in detail below with reference to the accompanying drawings.

It should be clear that the described embodiments are only a part of the embodiments of the present disclosure, but not all of the embodiments. Based on the embodiments in the present disclosure, all other embodiments obtained by those of ordinary skill in the art fall within the protection scope of the present disclosure.

The terms used in the embodiments of the present disclosure are only for the purpose of describing specific embodiments, and are not intended to limit the present disclosure. As used in the embodiments of this disclosure and the appended claims, the singular forms "a," "the," and "the" are intended to include the plural forms as well, unless the context clearly dictates otherwise.

It should be understood that the term "and/or" used in this document is only an association relationship to describe the associated objects, indicating that there can be three relationships, for example, A and/or B, which can indicate that A alone, A and B, and B alone. The character "/" in the present description generally indicates that the related objects are an "or" relationship.

In the description of this specification, it should be understood that words such as "substantially", "approximately", "about", and "roughly" described in the claims and embodiments of the present disclosure indicate being within reasonable technological operating ranges or tolerances, and can be generally identified, rather than a precise value.

It should be understood that although the terms first, second, third, etc. can be used in the embodiments of the present disclosure to describe directions, metal blocks, signal lines, etc. These directions, metal blocks, signal lines, and so on should not be limited to these terms. These terms are merely configured to distinguish directions, metal blocks, signal lines, and so on from each other. For example, without departing from the scope of the embodiments of the present disclosure, a first direction can also be referred to as a second direction, and similarly, a second direction can also be referred to as a first direction.

Through careful and in-depth research, the Applicant of the present disclosure provides solutions to the problems existing in the related art.

Figure 1:
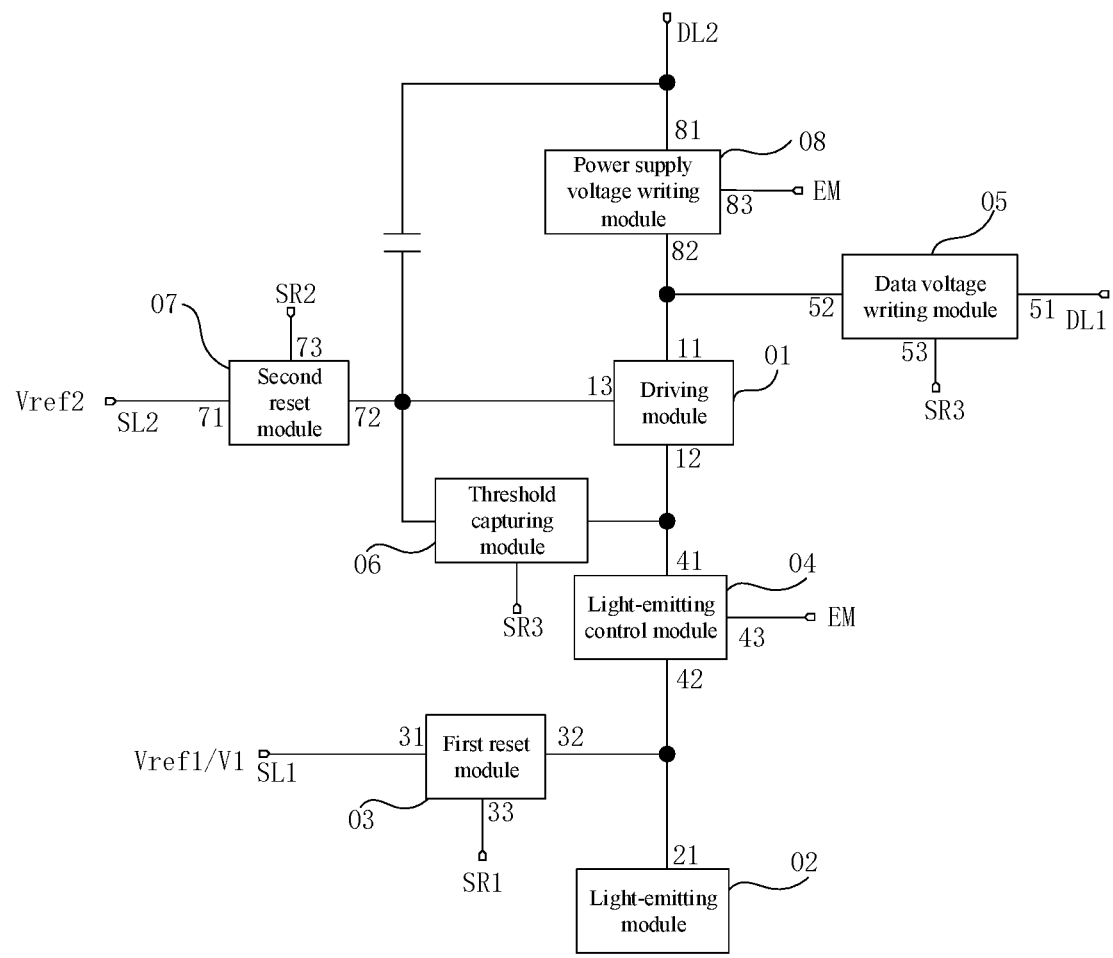
FIG. 1 is a schematic diagram illustrating a principle of a pixel driving circuit provided by some embodiments of the present disclosure.
Figure 2:
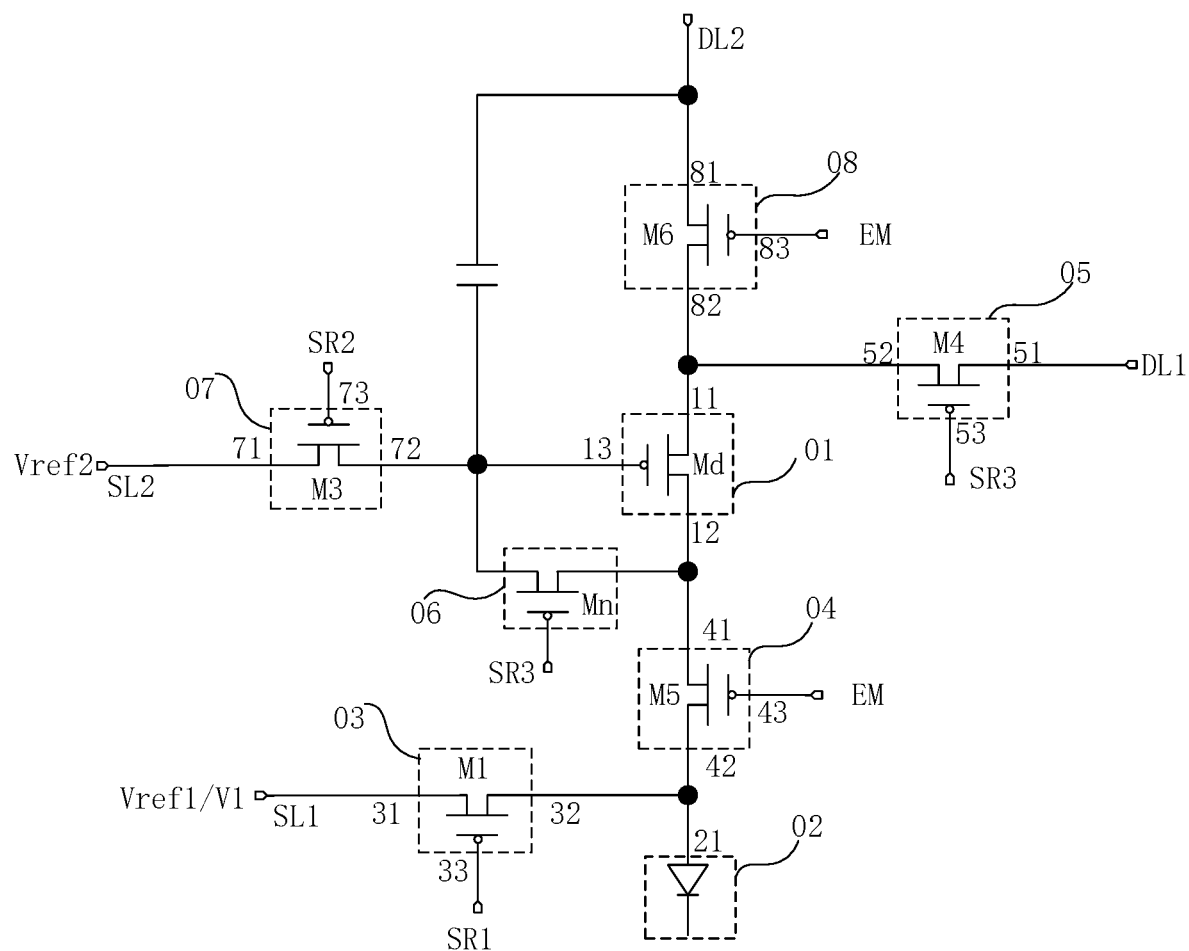
FIG. 2 is a schematic diagram of the pixel driving circuit shown in FIG. 1, according to an embodiment of the present disclosure.
Figure 3:
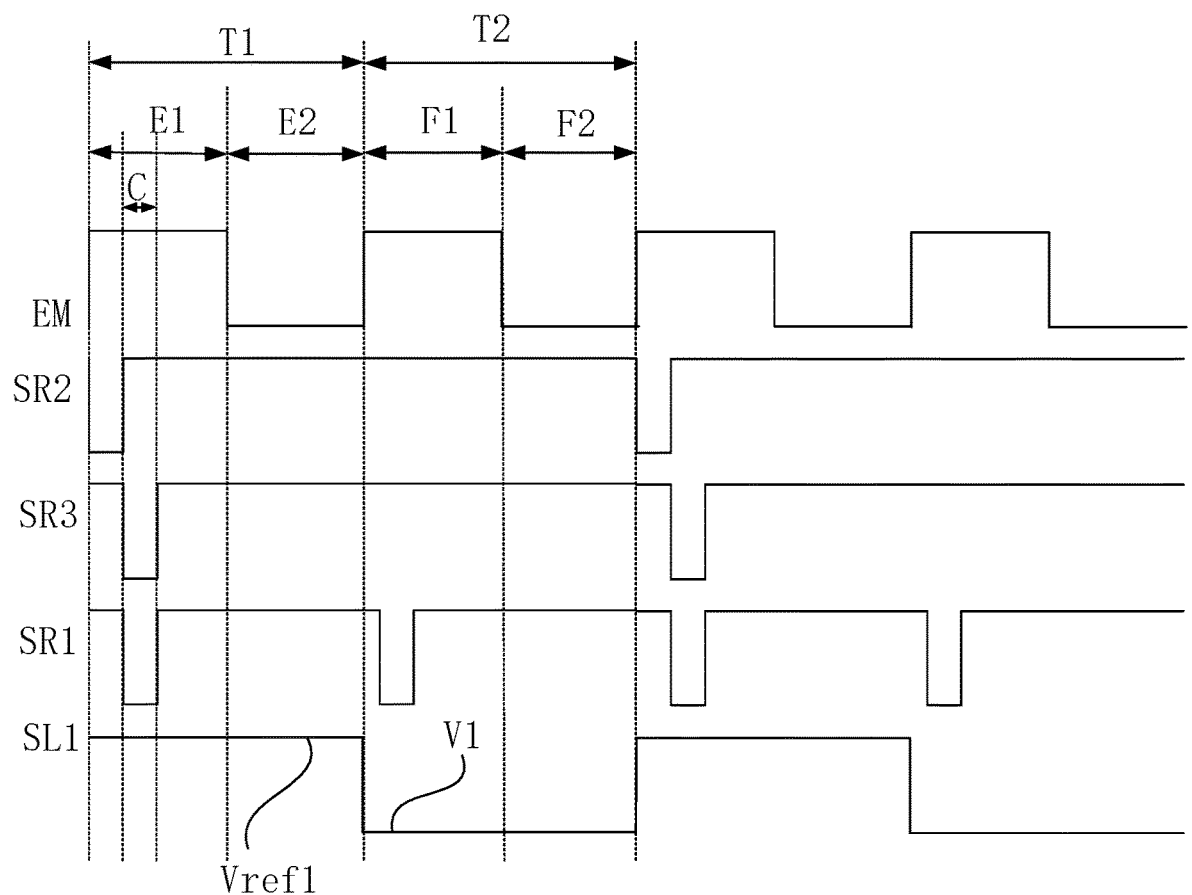
FIG. 3 is a working timing sequence of the pixel driving circuit shown in FIG. 2, according to an embodiment of the present disclosure.

FIG. 1 is a schematic diagram illustrating a principle of a pixel driving circuit provided by some embodiments of the present disclosure, FIG. 2 is a schematic diagram of the pixel driving circuit shown in FIG. 1, and FIG. 3 is a working timing sequence of the pixel driving circuit shown in FIG. 2.

With reference to FIG. 1 and FIG. 3, the pixel driving circuit 001 includes a driving module 01, a light-emitting module 02, and a first reset module 03. The driving module 01 is configured to generate a light-emitting driving current, and a first electrode 21 of the light-emitting module 02 is configured to receive the light-emitting driving current generated by the driving module 01. That is, the first electrode 21 of the light-emitting module 02 is an input terminal of the light-emitting module 02, and the light-emitting driving current generated by the driving module 01 drives the light-emitting module 02 to emit light. An output terminal 32 of the first reset module 03 is electrically connected to the first electrode 21 of the light-emitting module 02, and the first reset module 03 is configured to reset the first electrode of the light-emitting module 02.

The working timing sequence of the pixel driving circuit 001 includes multiple working periods T, and the working period T includes a first light-emitting stage T1 and a second light-emitting stage T2 after the first light-emitting stage T1.

The first light-emitting stage T1 includes a reset stage E1 and a light-emitting stage E2 after the reset stage E1. The first reset module 03 transmits a first reset voltage Vref1 to the first electrode 21 of the light-emitting module 02 during the reset stage E1 of the first light-emitting stage T1, thereby ensuring that the light-emitting module 02 can accurately generate the brightness corresponding to the received light-emitting driving current. That is, before the light-emitting stage E2 of the first light-emitting stage T1, an input terminal of the light-emitting module 02 is reset by the first reset voltage Vref1.

The second light-emitting stage T2 includes a reset stage F1 and a light-emitting stage F2 after the reset stage F1. The first reset module 03 transmits a modification reset voltage V1 to the first electrode 21 of the light-emitting module 02 during the reset stage F1 of the second light-emitting stage T2. That is, before the light-emitting stage F2 of the second light-emitting stage T2, the modification reset voltage V1 resets the input terminal of the light-emitting module 02. The modification reset voltage V1 is different from the first reset voltage Vref1.

For example, as shown in FIG. 2 and FIG. 3, the input terminal 31 of the first reset module 03 is electrically connected to a first reset signal line SL1, the output terminal 32 of the first reset module 03 is electrically connected to the first electrode 21 of the light-emitting module 02, and a control terminal 33 of the first reset module 03 is electrically connected to a first control line SR1. The first reset signal line SL1 transmits the first reset voltage Vref1 during the reset stage E1 of the first light-emitting stage T1, and transmits the modification reset voltage V1 during the reset stage F1 of the second light-emitting stage T2.

During the reset stage E1 of the first light-emitting stage T1, the first control line SR1 transmits a signal to control the first reset module 03 to be turned on, and the first reset module 03 transmits the received first reset voltage Vref1 to the first electrode 21 of the light-emitting module 02.

During the reset stage F1 of the second light-emitting stage T2, the first control line SR1 transmits a signal again to control the first reset module 03 to be turned on, and the first reset module 03 transmits the received modification reset voltage V1 to the first electrode 21 of the light-emitting module 02.

The driving module 01 includes a driving transistor Md. During the first light-emitting stage T1 of the display panel, in order to make the brightness of the light-emitting module 02 meet the requirements, a gate of the driving transistor Md needs to be reset, and then a data signal is written to the gate of the driving transistor Md. When the first electrode of the light-emitting module 02 and the driving module 01 are electrically conducted, the driving module 01 generates a light-emitting driving current flowing to the light-emitting module 02. After the first electrode of the light-emitting module 02 and the driving module 01 are electrically conducted, the light-emitting driving current flowing through the light-emitting module 01 has a ramping process, and a ramping speed of a voltage of the first electrode of the light-emitting module 02 directly affects a ramping speed of the light-emitting driving current flowing through the light-emitting module 02.

The ramping speed of the voltage of the first electrode of the light-emitting module 02 is related to an original potential at the first electrode of the light-emitting module 02 and a potential written to the first electrode of the light-emitting module 02 by the driving module 01. For example, the potential at the first electrode of the light-emitting module 02 changes from the original voltage to the voltage required for the light-emitting module 02 to emit light with a climbing process, and it takes certain time for the driving module 01 to change from being initially turned on to being fully turn-on, so there is a ramping process when the driving module 01 writes a voltage to the first electrode of the light-emitting module 02.

During the first light-emitting stage T1 and the second light-emitting stage T2 of the display panel, bias states of the driving transistors Md of the driving module 01 are different from each other, causing the driving module 01 to write voltages to the first electrode of the light-emitting module 02 during the two stages with different voltage ramping speed. For this reason, in the related art, the light-emitting brightness of the display panel during the first light-emitting stage T1 is significantly lower than the light-emitting brightness of the display panel during the second light-emitting stage T2. Especially, in the related art, in a low-grayscale and low-frequency display state of the display panel, significant flickering of the display screen frequently occurs for the display panel.

In the embodiments of the present disclosure, the second light-emitting stage T2 includes the reset stage F1, that is, before the light-emitting stage F2 of the second light-emitting stage T2, the first electrode of the light-emitting module 02 receives the modification reset voltage V1, and the potential of the light-emitting module 02 at an initial stage of the light-emitting stage F2 of the second light-emitting stage T2 is changed. That is, even if the speed at which the driving module 01 writes the voltage to the first electrode of the light-emitting module 02 during the light-emitting stage F2 of the second light-emitting stage T2 is different from the speed during the light-emitting stage E2 of the first light-emitting stage T1, by modifying the potential of the first electrode of the light-emitting module 02 during the reset stage F1 of the second light-emitting stage T2, the ramping speed of the voltage of the first electrode of the light-emitting module 02 during the light-emitting stage F1 of the second light-emitting stage T2 is changed, so that the ramping speed of the voltage of the first electrode of the light-emitting module 02 during the light-emitting stage F1 of the second light-emitting stage T2 is substantially the same as the ramping speed of the voltage of the first electrode of the light-emitting module 02 during the light-emitting stage E1 in the first light-emitting stage T1. Therefore, the embodiments of the present disclosure can reduce a difference between the ramping speed of the light-emitting driving current flowing through the light-emitting module 02 during the first light-emitting stage T1 and the ramping speed of the light-emitting driving current flowing through the light-emitting module 02 during the second light-emitting stage T2, thereby reducing a brightness difference of the display panel during the first light-emitting stage T1 and the second light-emitting stage T2, and thus improving the display effect of the display panel.

In some embodiments of the present disclosure, the first electrode 21 of the light-emitting module 02 can be an anode of a light-emitting diode, and the potential of the modification reset voltage V1 can be lower than the potential of the first reset voltage Vref1, so as to reduce the original potential of the first electrode 21 of the light-emitting module 02 before the light-emitting stage F2 of the second light-emitting stage T2. By reducing the original potential of the first electrode 21 of the light-emitting module 02 before the light-emitting stage F2 of the second light-emitting stage T2, a speed at which the potential of the first electrode of the light-emitting module 02 changes from the original potential during the light-emitting stage F2 of the second light-emitting stage T2 to a preset potential can be reduced.

In the related art, a speed at which the driving module 01 is turned on during the first light-emitting stage T1 is significantly lower than a speed at which the driving module 01 is turned on during the second light-emitting stage T2. By setting the potential of the modification reset voltage V1 to be lower than the potential of the first reset voltage Vref1, the time for the driving module 01 to write the potential of the first electrode 21 of the module 02 to a preset value during the first light-emitting stage T1 and the second light-emitting stage T2 is approximately the same, thereby reducing the ramping speed of the light-emitting driving current flowing through the light-emitting module 02 during the second light-emitting stage T2, thereby reducing the brightness of the display panel during the second light-emitting stage T2, improving the brightness uniformity of the display panel during the first light-emitting stage T1 and during the second light-emitting stage T2, and thus improving the display effect of the display panel.

In some embodiments, a difference between the modification reset voltage V1 and the first reset voltage Vref1 is greater than 1V, that is, the potential of the first electrode of the light-emitting module 02 during the reset stage F1 of the second light-emitting stage T1 is 1V lower than the potential of the first electrode of the light-emitting module 02 during the reset stage E2 of the second light-emitting stage T2. In this way, by reducing the potential of the first electrode of the light-emitting module 02 before the light-emitting stage F2 of the second light-emitting stage T1, the ramping speed of the potential of the first electrode of the light-emitting module 02 during the light-emitting stage F2 of the second light-emitting stage T1 can be effectively reduced. In this way, it is ensured that a difference between the ramping speed of the light-emitting driving current flowing through the light-emitting module 02 during the second light-emitting stage T2 and the ramping speed of the light-emitting driving current flowing through the light-emitting module 02 during the first light-emitting stage T1 is small, thereby improving the brightness uniformity of the display panel during the first light-emitting stage T1 and during the second light-emitting stage T2, and thus improving the display effect of the display panel.

It can be seen from the above analysis that when the difference between the modification reset voltage V1 and the first reset voltage Vref1 is greater than 1V, a difference between the ramping speed of the current received by the light-emitting module 02 during the second light-emitting stage T2 and the ramping speed of the current received by the light-emitting module 02 during the first light-emitting stage T1 can be small, so that the brightness of the display panel during the first light-emitting stage T1 and the brightness of the display panel during the second light-emitting stage T2 tends to be the same. At the same time, considering that the charging speeds of sub-pixels of different colors in the display panel are different from each other, if a voltage difference between the modification reset voltage V1 and the first reset voltage Vref1 is too large, a difference in the charging speeds of sub-pixels of different colors will be exacerbated, which will cause color cast in the display panel. Furthermore, if the voltage difference between the modification reset voltage V1 and the first reset voltage Vref1 is too large, it can also lead to an excessive reduction in the ramping speed of the current received by the light-emitting module 02 during the second light-emitting stage T2, as a result, the brightness of the display panel during the second light-emitting stage T2 may be lower than the brightness of the display panel during the first light-emitting stage T1.

Therefore, it is verified through experiments that when a voltage difference between the modification reset voltage V1 and the first reset voltage Vref1 ranges from 1V to 3V, it can not only solve the problem of different brightness of the display panel during different stages, but also avoid color cast.

The embodiments of the present disclosure do not limit a specific structure of the pixel driving circuit 001. The pixel driving circuit 001 that executes the first light-emitting stage T1 and the second light-emitting stage T2 can apply the solutions provided by the embodiments of the present disclosure, which can solve the problem of a difference between the brightness of the display panel during the first light-emitting stage T1 and the brightness of the display panel during the second light-emitting stage T2.

With reference to FIG. 1 and FIG. 3 again, in some embodiments of the present disclosure, the pixel driving circuit 001 includes a light-emitting control module 04, an input terminal 41 of the light-emitting control module 04 is electrically connected to the output terminal 12 of the driving module 01, and an output terminal of the light-emitting control module 04 is electrically connected to the first electrode 21 of the light-emitting module 02. In this case, the light-emitting control module 04 can control the lighting driving current generated by the driving module 01 to be transmitted to the light-emitting module 02.

During the reset stage E1 of the first light-emitting stage T1 and the reset stage F1 of the second light-emitting stage T2, the light-emitting control module 04 is turned off and cannot transmit the lighting driving current to the lighting module 02.

During the light-emitting stage E2 of the first light-emitting stage T1 and the light-emitting stage F2 of the second light-emitting stage T2, the light-emitting control module 04 is turned on and can transmit the light-emitting driving current to the light-emitting module 02.

With reference to FIG. 2 and FIG. 3, the control terminal 43 of the light-emitting control module 04 is electrically connected to a light-emitting control signal line EM. During the reset stage E1 of the first light-emitting stage T1 and the reset stage F1 of the second light-emitting stage T2, the light-emitting control signal line EM transmits a signal to control the light-emitting module 04 to be turned off. During the light-emitting stage E2 of the first light-emitting stage T1 and the light-emitting stage F2 of the second light-emitting stage T2, the light-emitting control signal line EM transmits a signal to control the light-emitting module 04 to be turned on.

Figure 4:
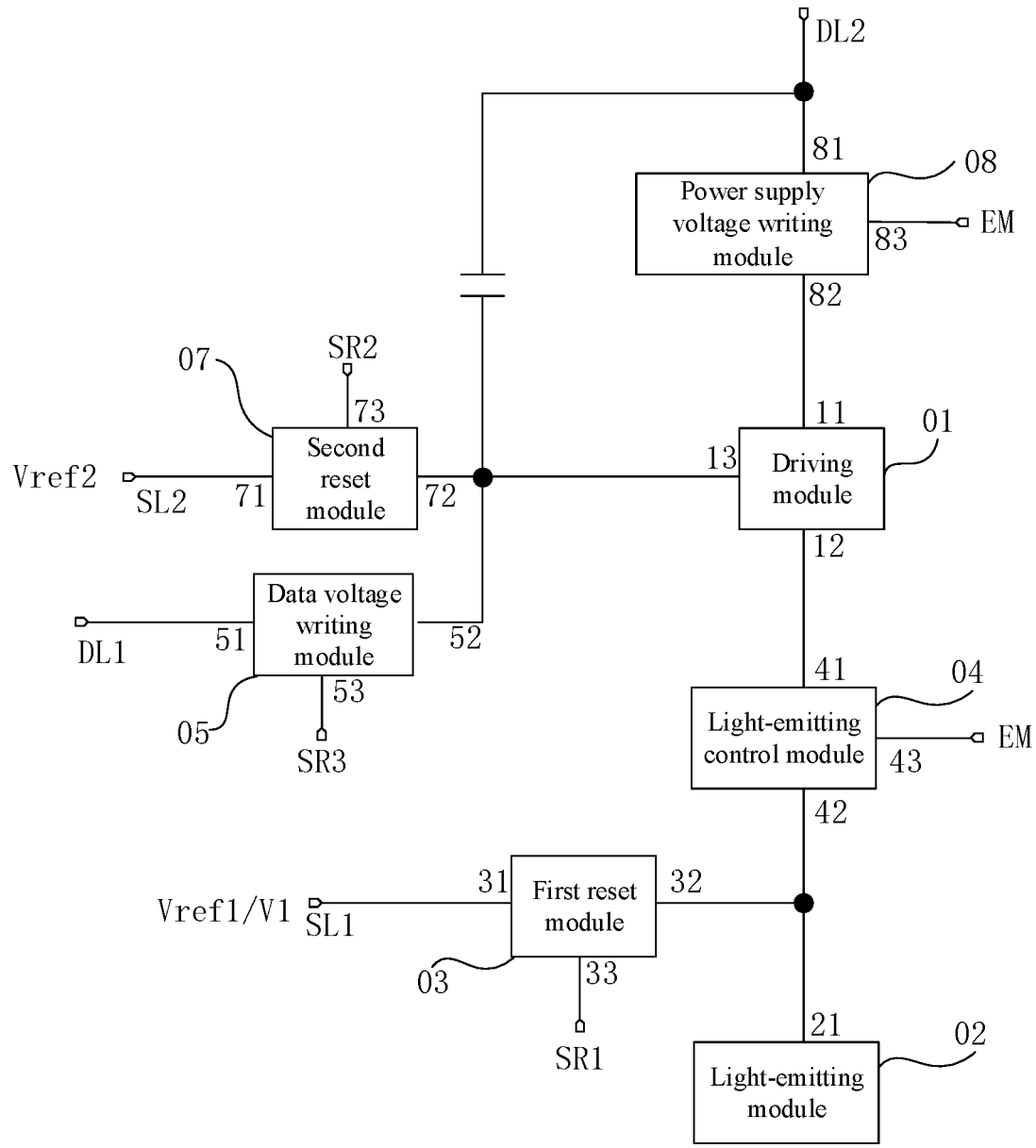
FIG. 4 is a schematic diagram illustrating a principle of another pixel driving circuit provided by some embodiments of the present disclosure.

FIG. 4 is a schematic diagram illustrating a principle of another pixel driving circuit provided by some embodiments of the present disclosure.

In some embodiments of the present disclosure, as shown in FIG. 1 and FIG. 4, the pixel driving circuit 001 includes a data voltage writing module 05, the data voltage writing module 05 is electrically connected to the driving module 01, and the data voltage writing module 05 is configured to provide a data voltage Vdata to a control terminal 13 of the driving module 01.

In some embodiments, as shown in FIG. 3, the first light-emitting stage T1 includes a data voltage writing stage C. During the data voltage writing stage C, the data voltage writing module 05 writes the data voltage Vdata to the control terminal 13 of the driving module 01.

In some embodiments, as shown in FIG. 1, an input terminal 51 of the data voltage writing module 05 is electrically connected to a data voltage signal line DL1, and an output terminal 52 of the data voltage writing module 05 can be electrically connected to an input terminal 11 of the driving module 01 and is configured to transmit the data voltage Vdata to the input terminal of the driving module 01. During the data writing stage C, the data voltage writing module 05 is turned on, the driving module 01 and a threshold compensation module 06 are turned on, and the data voltage Vdata transmitted by the data voltage signal line DL1 is written to the control terminal 13 of the driving module 01. In addition, as shown in FIG. 4, the output terminal 52 of the data voltage writing module 05 can be electrically connected to the control terminal 13 of the driving module 01, and be configured to directly write the data voltage Vdata transmitted by the data voltage signal line DL1 to the control terminal 13 of the driving module 01 during the data writing stage C.

As shown in FIG. 1 and FIG. 4, in some embodiments of the present disclosure, the pixel driving circuit 001 includes a second reset module 07, and an output terminal 72 of the second reset module 07 is electrically connected to the control terminal 13 of the driving module 01.

During the reset stage E1 of the first light-emitting stage T1, the second reset module 07 provides a second reset voltage Vref2 to the control terminal 13 of the driving module 01, and the second reset voltage is different from the modification reset voltage V1.

It can be understood that the providing the second reset voltage Vref2 by the second reset module 07 to the control terminal 13 of the driving module 01 and the providing the first reset voltage Vref1 by the first reset module 03 to the light-emitting module 02 can be performed simultaneously. In some embodiments, the providing the second reset voltage Vref2 by the second reset module 07 to the control terminal 13 of the driving module 01 and the providing the first reset voltage Vref1 by the first reset module 03 to the light-emitting module 02 can also be performed during different periods of the reset stage E1 of the first light-emitting stage T1.

In some embodiment, the data voltage writing stage C is executed after the second reset module 07 provides the second reset voltage Vref2 to the control terminal 13 of the driving module 01.

Figure 5:
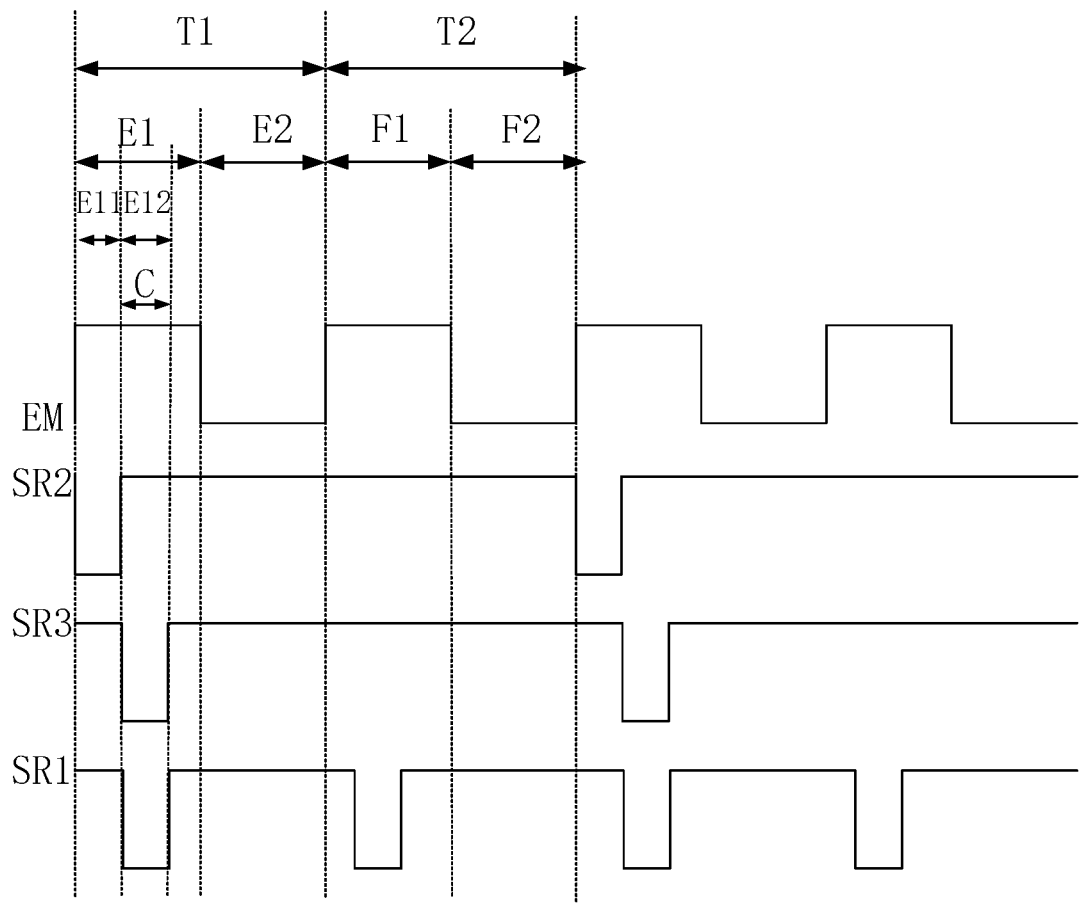
FIG. 5 is another working timing sequence of the pixel driving circuit shown in FIG. 2, according to an embodiment of the present disclosure.

FIG. 5 is another working timing sequence of the pixel driving circuit shown in FIG. 2.

In some embodiments, as shown in FIG. 5, the reset stage E1 of the first light-emitting stage T1 includes a first reset sub-stage E11 and a second reset sub-stage E12 after the first reset sub-stage E11.

During the first reset sub-stage E11 of the first light-emitting stage T1, the second reset module 07 writes the second reset voltage Vref2 to the control terminal 13 of the driving module 01.

During the second reset sub-stage E12 of the first light-emitting stage T1, the first reset module 03 writes the first reset voltage Vref1 to the first electrode 21 of the light-emitting module 02.

In some embodiments, the second reset sub-stage E12 may include the data voltage writing stage C, thereby shortening the duration of a working period of the pixel driving circuit 001.

Figure 6:
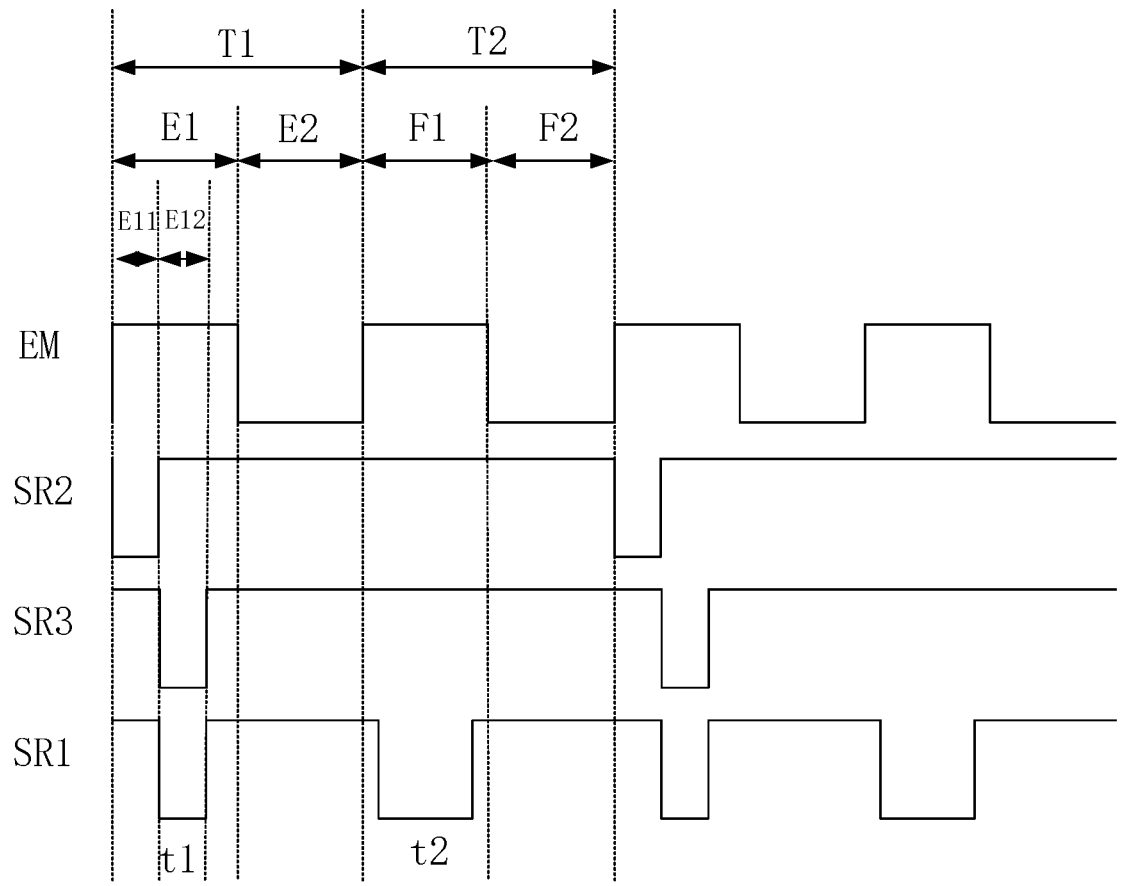
FIG. 6 is another working timing sequence of the pixel driving circuit shown in FIG. 2, according to an embodiment of the present disclosure.

FIG. 6 is another working timing sequence of the pixel driving circuit shown in FIG. 2.

In some embodiments of the present disclosure, as shown in FIG. 6, during the reset stage E1 of the first light-emitting stage T1, the first reset module 03 transmits the first reset voltage Vref1 to the first electrode 21 of the light-emitting module 02 for a duration of t1; and during the reset stage F1 of the second light-emitting stage T2, the first reset module 03 transmits the modification reset voltage V1 to the first electrode 21 of the light-emitting module 02 for a duration of t2.

In some embodiments, t2>t1. That is, the duration for the first reset module 03 to transmit the modification reset voltage V1 during the reset stage F1 of the second light-emitting stage T2 is longer than the duration for the first reset module 03 to transmit the first reset voltage Vref1 during the reset stage E1 of the first light-emitting stage T1.

In the embodiments of the present disclosure, by increasing the duration during which the first reset module 03 transmits the modification reset voltage V1 during the reset stage F1 of the second light-emitting stage T2, the light-emitting module 02 can be reset more fully. That is, the potential of the first electrode of the reset module 02 is much closer to the preset reset voltage V1. The solution of these embodiments of the present disclosure can reduce the ramping speed of the light-emitting driving current flowing through the light-emitting module 02.

As shown in FIG. 2, in some embodiments of the present disclosure, the driving module 02 includes a driving transistor Md, and a gate of the driving transistor Md is electrically connected to the output terminal 72 of the second reset module 07. The second reset module 07 is configured to write the second reset voltage Vref2 to the gate of the driving transistor Md.

The driving transistor Md is a P-channel transistor, and the second reset voltage Vref2 is greater than the modification reset voltage V1.

In some embodiments, the second reset voltage Vref2 is greater than the first reset voltage Vref1.

In some embodiments of the present disclosure, the driving transistor Md is a P-channel transistor, when a voltage of the source of the driving transistor Md is greater than a voltage of the gate, the driving transistor Md is turned on. At the same time, if the second reset voltage Vref2 is set larger, when the data voltage Vdata is written thereto, a difference between the voltage of the source and the voltage of the gate of the driving transistor Md is smaller, so that the data voltage Vdata is written thereto more fully, which is beneficial to improve the threshold compensation effect of the driving transistor Md.

In some embodiments of the present disclosure, with reference to FIG. 1 and FIG. 3, or with reference to FIG. 4 and FIG. 3, the input terminal 31 of the first reset module 03 is electrically connected to the first reset signal line SL1, and the output terminal 32 of the first reset module 03 is electrically connected to the first electrode 21 of the light-emitting module 02.

During the reset stage E1 of the first light-emitting stage T1, the first reset signal line SL1 transmits the first reset voltage Vref1; during the reset stage F1 of the second light-emitting stage T2, the first reset signal line SL1 transmits the modification reset voltage V1 different from the first reset voltage Vref1. That is, in the display panel, the first reset voltage Vref1 and the modification reset voltage V1 can be transmitted by a same first reset signal line SL1 respectively during different periods.

The display panel includes multiple pixel driving circuits 001, and the first reset voltage Vref1 and the modification reset voltage V1 in the display panel can be shared. That is, multiple pixel driving circuits 001 in the display panel 001 can share the first reset voltage Vref1 and the modification reset voltage V1.

It can be understood that, in the display panel, the pixel driving circuits 001 in a first row first enter the first light-emitting stage T1, and the pixel driving circuits 001 in a last row finally enter the first light-emitting stage T1.

In some embodiments of the present disclosure, as shown in FIG. 3, during the reset stage E1 of the first light-emitting stage T1, the first reset signal line SL1 transmits the first reset voltage Vref1. After pixel driving circuits 001 in the last row complete the reset stage E1 of the first light-emitting stage T1, starting from the pixel driving circuits 001 in the first row, the pixel driving circuits 001 in all rows sequentially enter the second light-emitting stage T2, and the first reset signal line SL1 transmits the modification reset voltage V1 during the reset stage F1 of the second light-emitting stage T2.

With reference to FIG. 1 and FIG. 5, or with reference to FIG. 4 and FIG. 5, the input terminal 71 of the second reset module 07 is electrically connected to a second reset signal line SL2.

During the first reset sub-stage E11 of the first light-emitting stage T1, the second reset signal line SL2 transmits the second reset signal Vref2.

During the second reset sub-stage E12 of the first light-emitting stage T1, the first reset signal line SL1 transmits the first reset signal Vref1.

Since the output terminal 72 of the second reset module 07 is electrically connected to the control terminal 13 of the driving module 01, the output terminal 32 of the first reset module 03 is electrically connected to the first electrode 21 of the light-emitting module 02.

It can be understood that, during the first reset sub-stage E11 of the first light-emitting stage T1, the second reset module 07 writes the received second reset voltage Vref2 to the control terminal 13 of the driving module 01.

During the second reset sub-stage E12 of the first light-emitting stage T1, the first reset module 03 writes the received first reset voltage Vref1 to the first electrode 21 of the light-emitting module 02.

A working process of the pixel driving circuit will be described below with reference to FIG. 2 and FIG. 5.

As shown in FIG. 2, the driving module 01 includes a driving transistor Md, a source of the driving transistor Md is electrically connected to the input terminal 11 of the driving module 01, a drain of the driving transistor Md is electrically connected to the output terminal 12 of the driving module 01, and a gate of the driving transistor Md is electrically connected to the control terminal 13 of the driving module 01. The first reset module 03 includes a first transistor M1, a source of the first transistor M1 is electrically connected to the first reset signal line SL1, a drain of the first transistor M1 is electrically connected to the first electrode 21 of the light-emitting module 02, and a gate of the first transistor M1 is electrically connected to the first control line SR1. The second reset module 07 includes a third transistor M3, a source of the third transistor M3 is electrically connected to the second reset signal line SL2, a drain of the third transistor M3 is electrically connected to the gate of the driving transistor Md, and a gate of the third transistor M3 is electrically connected to a second control line SR2. The data voltage writing module 05 includes a fourth transistor M4, a source of the fourth transistor M4 is electrically connected to the data voltage signal line DL1, a drain of the fourth transistor M4 is electrically connected to the source of the driving transistor Md, and a gate of the fourth transistor M4 is electrically connected to a third control line SR3. The threshold compensation module 06 includes a threshold transistor Mn, a source of the threshold transistor Mn is electrically connected to the drain of the driving transistor Md, a drain of the threshold transistor Mn is electrically connected to the gate of the driving transistor Md, and a gate of the threshold transistor Mn is electrically connected to the third control line SR3. The light-emitting control module 04 includes a fifth transistor M5, a source of the fifth transistor M5 is electrically connected to the drain of the driving transistor Md, a drain of the fifth transistor M5 is electrically connected to the first electrode 21 of the light-emitting module 02, and a gate of the fifth transistor M5 is electrically connected to the light-emitting control signal line EM.

The pixel driving circuit 001 further include a power supply voltage writing module 08, an input terminal 81 of the power supply voltage writing module 08 is electrically connected to the power supply voltage signal line DL2, an output terminal 82 of the power supply voltage writing module 08 is electrically connected to the input terminal 11 of the driving module 01, and a control terminal 83 of the power supply voltage writing module 08 is electrically connected to the light-emitting control signal line EM. The power supply voltage writing module 08 can include a sixth transistor M6, a source of the sixth transistor M6 is electrically connected to the power supply voltage signal line DL2, a drain of the sixth transistor M6 is electrically connected to the source of the driving transistor Md, and a gate of the sixth transistor M6 is electrically connected to the light-emitting control signal line EM.

In an example, the first transistor M1, the third transistor M3, the fourth transistor M4, the fifth transistor M5, the sixth transistor M6, and the threshold compensation transistor Mn are P-type transistors; and the second reset sub-stage E12 of the first light-emitting stage T1 includes the data voltage writing stage C. The embodiments of the present disclosure will be described in the following by taking this example. As will be understood, in other examples, any one of the above transistors may also be an N-type transistor.

During the first reset sub-stage E11 of the first light-emitting stage T1, the second control line SR2 transmits a turn-on signal, and the third transistor M3 is turned on; the first control line SR1 transmits a turn-off signal, and the first transistor M1 is turned off; the third control line SR3 transmits a turn-off signal, and the fourth transistor M4 and the threshold compensation transistor Mn are turned off; the light-emitting control signal line EM transmits a turn-off signal, and the fifth transistor M5 and the sixth transistor M6 are turned off. At the same time, the second reset signal line SL2 transmits the second reset voltage Vref2, and the second reset voltage Vref2 reaches the gate of the driving transistor Md through the turned-on third transistor M3 to reset the driving transistor Md.

During the second reset sub-stage E12 of the first light-emitting stage T1, the second control line SR2 transmits a turn-off signal, and the third transistor M3 is turned off; the first control line SR1 transmits a turn-on signal, and the first transistor M1 is turned on; the third control line SR3 transmits a turn-on signal, and the four transistors M4 and the threshold compensation transistor Mn are turned on; the light-emitting control signal line EM transmits a turn-off signal, and the fifth transistor M5 and the sixth transistor M6 are turned off. At the same time, the first reset signal line SL1 transmits the first reset voltage Vref1, and the first reset voltage Vref1 reaches the first electrode 21 of the light-emitting module 02 through the turned-on first transistor M1 to reset the light-emitting module 02. In some embodiments, the light-emitting module 02 includes an organic light-emitting diode, and the first reset voltage Vref1 resets an anode of the organic light-emitting diode through the turned-on first transistor M1.

At the same time, the data voltage signal line DL1 transmits the data voltage Vdata. At the beginning of the data voltage writing stage C, the potential of the gate of the driving transistor Md is the second reset voltage Vref2, and the potential of the source of the driving transistor Md is the data voltage Vdata. A difference between the potential of the source and the potential of the gate of the transistor Md is (Vdata−Vref2) and greater than 0. Therefore, the driving transistor Md is turned on, and the data voltage Vdata is transmitted to the gate of the driving transistor Md through the turned-on driving transistor Md and the turned-on threshold compensation transistor Mn, so that the potential of the gate of the driving transistor Md gradually increases. When the potential of the gate of the driving transistor Md is equal to (Vdata−|Vth|), the driving transistor Td is turned off. At this time, during the data voltage writing stage C, the potential of the gate of the light-emitting driving transistor Td is maintained at (Vdata−|Vth|), where Vth denotes a threshold voltage of the driving transistor Td.

During the light-emitting stage E2 of the first light-emitting stage T1, the first control line SR1, the second control line SR2, and the third control line SR3 each transmit a turn-off signal, and the first transistor M1, the third transistor M3, the fourth transistor M4, the threshold compensation transistor Mn are all turned off; the light-emitting control signal line EM transmits a turn-on signal, and the fifth transistor M5 and the sixth transistor M6 are turned on. Meanwhile, the power supply voltage signal line DL2 transmits the power supply voltage VDD, that is, the potential of the source of the driving transistor Md is the power supply voltage VDD. Since the potential of the power supply voltage VDD is greater than the potential of the data voltage Vdata, the driving transistor Td generates a light-emitting driving current and transmits it to the first electrode 21 of the light-emitting module 02 through the fifth transistor M5 to control the light-emitting module 02 to emit light.

During the reset stage F1 of the second light-emitting stage T2, the first control line SR1 transmits a turn-on signal, and the first transistor M1 is turned on; the second control line SR2, the third control line SR3, and the light-emitting control signal line EM each transmit a turn-off signal, and the third transistor M3, the fourth transistor M4, the threshold compensation transistor Mn, the fifth transistor M5, and the sixth transistor M6 are all turned off. Meanwhile, the first reset signal line SL1 transmits the modification reset voltage V1, and the modification reset voltage V1 reaches the first electrode 21 of the light-emitting module 02 through the turned-on first transistor M1, to reset the light-emitting module 02.

The light-emitting stage F2 of the second light-emitting stage T2 has a same working process as the light-emitting stage E2 of the first light-emitting stage T1, and details are not repeated herein.

It should be understood that the stage during which the light-emitting module 02 is reset by the first reset voltage Vref1 can overlap with the stage during which the gate of the driving transistor Md is reset by the second reset voltage Vref2 in the working timing sequence of the pixel driving circuit 001; and the data voltage writing stage C is executed after the stage during which the gate of the driving transistor Md is reset by the second reset voltage Vref2.

During the first reset sub-stage E11 of the first light-emitting stage T1, the gate of the driving transistor Md is reset; and during the second reset sub-stage E12 of the first light-emitting stage T1, the first electrode 21 of the light-emitting module 02 is reset, and the data voltage is written to the gate of the driving transistor Md. During the second light-emitting stage T2, the gate of the driving transistor Md is no longer reset and the data voltage is no longer written to the driving transistor Md, which results in a big difference between a bias state of the driving transistor Md at the beginning of the light-emitting stage F2 of the second light-emitting stage T2 and a bias state of the driving transistor Md at the beginning of the light-emitting stage E2 of the first light-emitting stage T1. In this way, there is a big difference between the ramping speed at which the driving transistor Md generates the light-emitting driving current at the beginning of the light-emitting stage E2 of the first light-emitting stage T1 and a ramping speed at which the driving transistor Md generates the light-emitting driving current at the beginning of the light-emitting stage F2 of the second light-emitting stage T2. The ramping speed of the light-emitting driving current flowing through the light-emitting module 02 affects the brightness of the light-emitting module 02, which results in poor uniformity of the brightness of the display panel during the first light-emitting stage T1 and during the second light-emitting stage T2, thereby affecting a normal display of the display panel.

In the embodiments of the present disclosure, the pixel driving circuit 001 resets the light-emitting module 02 again before the light-emitting stage F2 of the second light-emitting stage T2, to change the ramping speed of the light-emitting driving current flowing through the light-emitting module 02 during the second light-emitting stage T2, thereby reducing a difference between the light-emitting driving current flowing through the light-emitting module 02 during the first light-emitting stage T1 and the light-emitting driving current flowing through the light-emitting module 02 during the second light-emitting stage T2. Therefore, a difference between the brightness of the light-emitting module 02 during the first light-emitting stage T1 and the brightness of the light-emitting module 02 during the second light-emitting stage T2 is reduced, thereby improving the display effect of the display panel.

Figure 7:
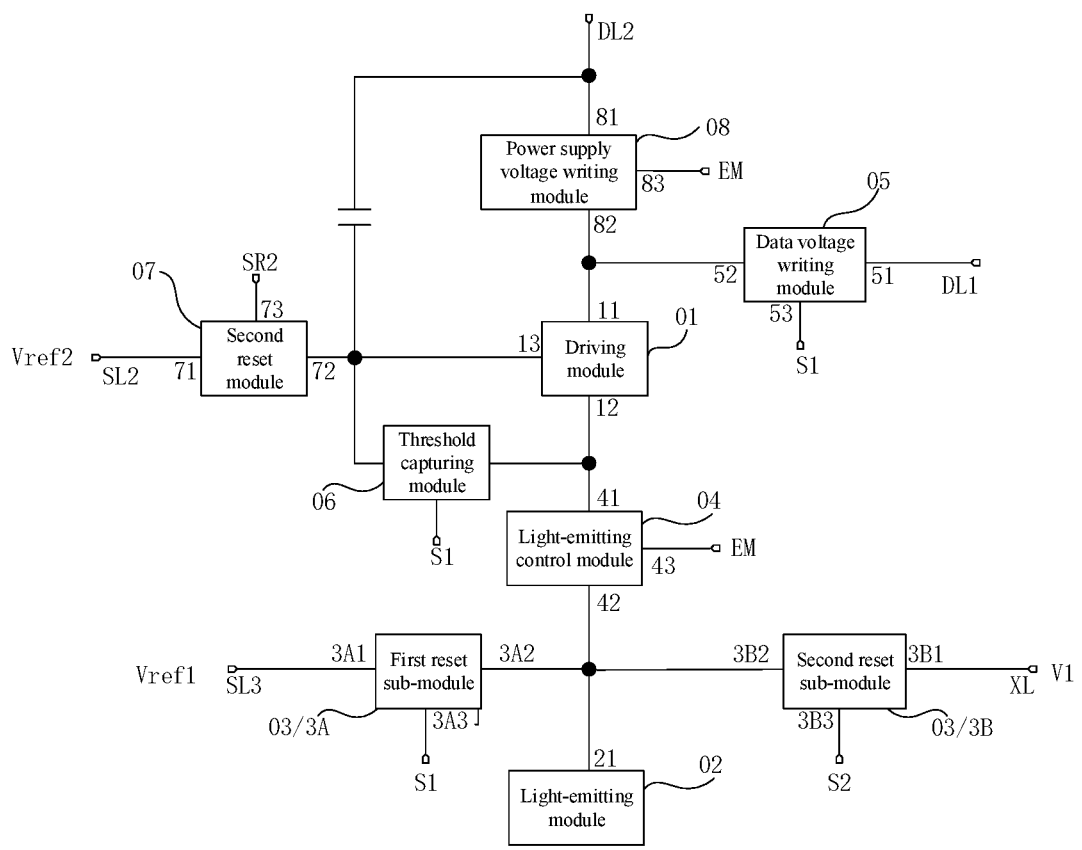
FIG. 7 is a schematic diagram illustrating a principle of another pixel driving circuit provided by some embodiments of the present disclosure.
Figure 8:
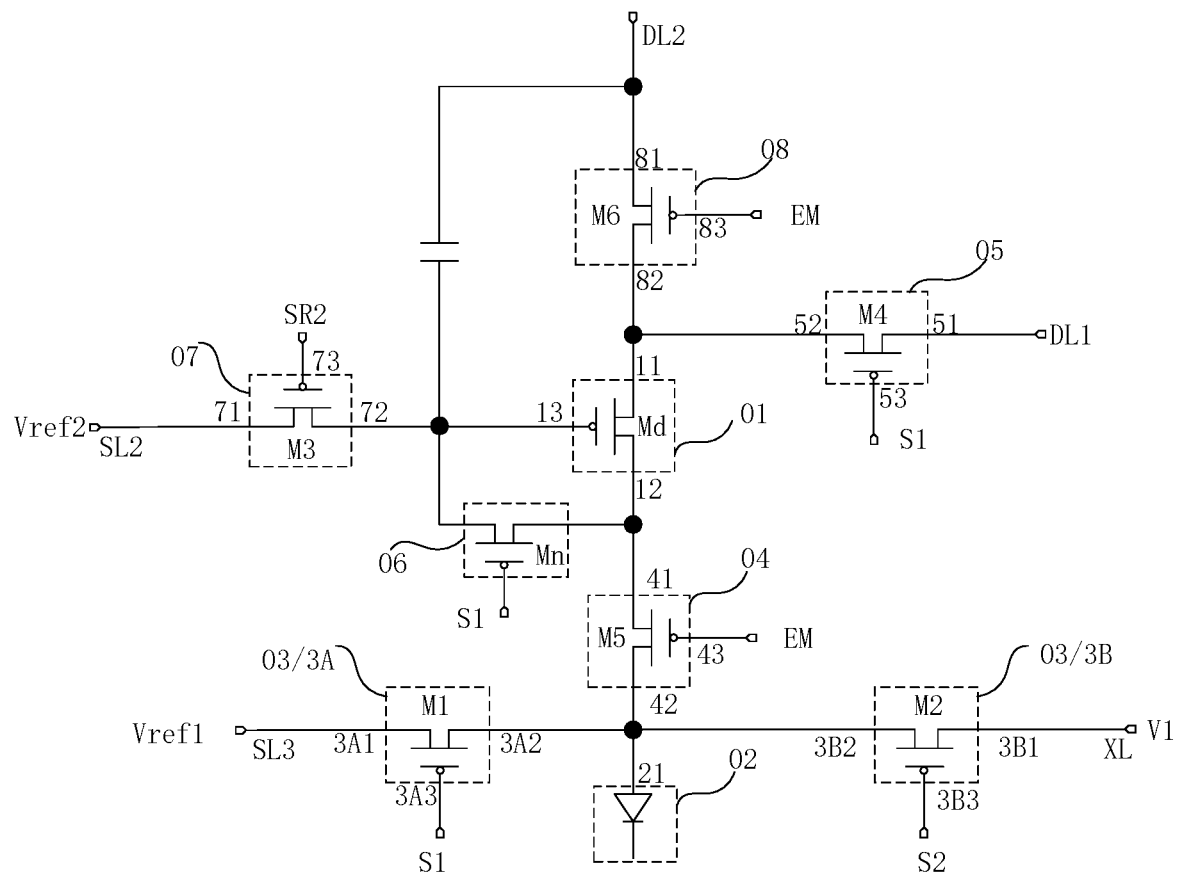
FIG. 8 is a schematic diagram of the pixel driving circuit shown in FIG. 7, according to an embodiment of the present disclosure.
Figure 9:
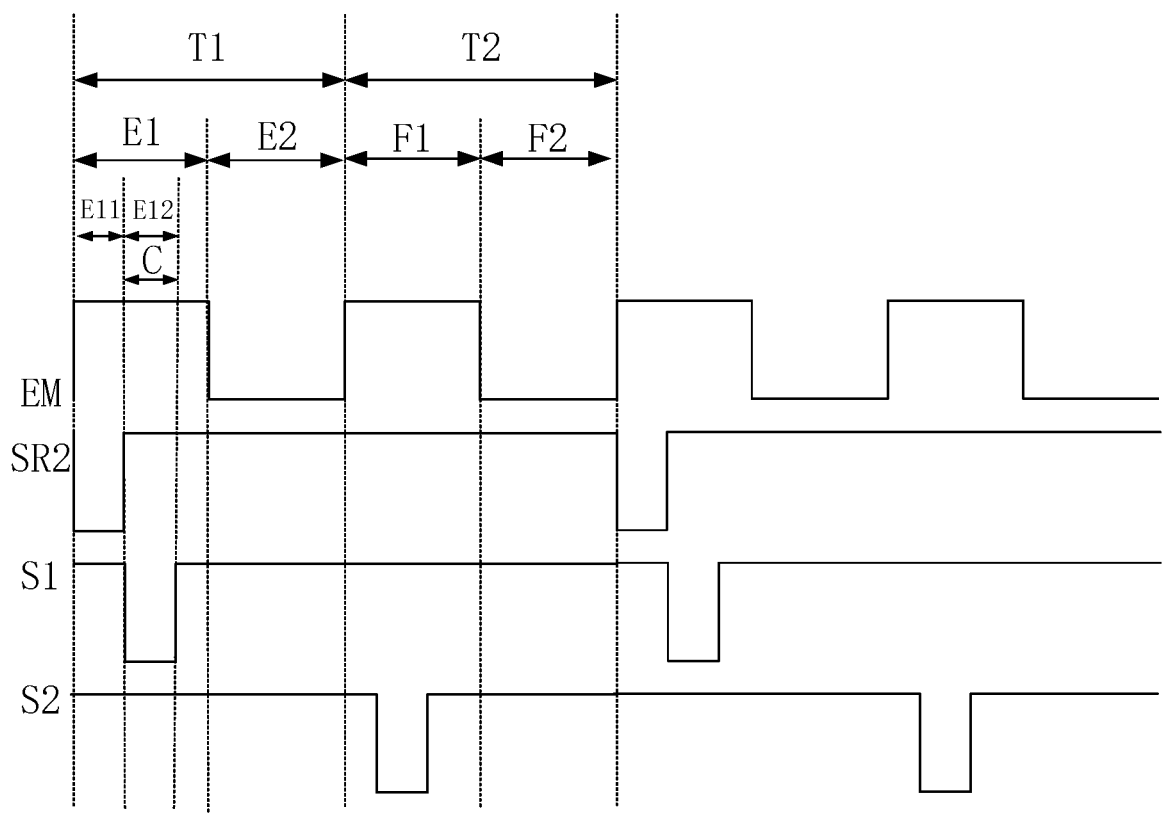
FIG. 9 is a working timing sequence of the pixel driving circuit shown in FIG. 8, according to an embodiment of the present disclosure.

FIG. 7 is a schematic diagram illustrating a principle of another pixel driving circuit provided by some embodiments of the present disclosure, FIG. 8 is a schematic diagram of the pixel driving circuit shown in FIG. 7, and FIG. 9 is a working timing sequence of the pixel driving circuit shown in FIG. 8.

In other embodiments of the present disclosure, with reference to FIG. 7 and FIG. 9, the first reset module 03 includes a first reset sub-module 3A and a second reset sub-module 3B, an input terminal 3A1 of the first reset sub-module 3A is electrically connected to the third reset signal line SL3, and an output terminal 3A2 of the first reset sub-module 3A is electrically connected to the first electrode 21 of the light-emitting module 02.

An input terminal 3B1 of the second reset sub-module 3B is electrically connected to a modification reset signal line XL, and an output terminal 3B2 of the second reset sub-module 3B is electrically connected to the first electrode 21 of the light-emitting module 02.

During the reset stage E1 of the first light-emitting stage T1, the third reset signal line SL3 transmits the first reset voltage Vref1, and the first reset sub-module 3A is turned on. That is, during the reset stage E1 of the first light-emitting stage T1, the first reset sub-module 3A transmits the received first reset voltage Vref1 to the first electrode 21 of the light-emitting module 02.

During the reset stage F1 of the second light-emitting stage T2, the modification reset signal line XL transmits the modification reset voltage V1, and the second reset sub-module 3B is turned on. That is, during the reset stage F1 of the second light-emitting stage T2, the second reset sub-module 3B transmits the received modification reset voltage V1 to the first electrode 21 of the light-emitting module 02.

In the embodiments of the present disclosure, the first reset voltage Vref1 and the modification reset voltage V1 are transmitted by different signal lines. Then, in the display panel, the first reset voltage Vref1 and the modification reset voltage V1 can be provided by different signal sources. For example, the third reset signal line SL3 transmits only the first reset voltage Vref1, and the modification reset signal line XL transmits only the modification reset voltage V1, in this case, a signal transmitted on the third reset signal line SL3 and a signal transmitted on the modification reset signal line XL do not need to jump, and the first reset voltage Vref1 and the modification reset voltage V1 can be simultaneously transmitted to different pixel driving circuits, respectively. The embodiments of the present disclosure are configured to reduce power consumption caused by signal jumps, and because the transmission of the first reset voltage Vref1 and the transmission of the modification reset voltage V1 do not interfere with each other, also configured to simplify the design of a peripheral driving circuit of the display panel and reduce the design difficulty.

It should be understood that when multiple pixel driving circuits of the display panel are in operation in different working timing sequences, the first reset voltage Vref1 and the modification reset voltage V1 provided by the embodiments of the present disclosure do not interfere with each other, and are transmitted to corresponding pixel driving circuits, respectively.

For example, when the pixel driving circuits in the first row of the display panel enter the reset stage F1 of the second light-emitting stage T2, and the pixel driving circuits in the last row of the display panel enter the reset stage E1 of the first light-emitting stage T1, the third reset signal line SL3 can transmit the first reset voltage Vref1 to the pixel driving circuits in the last row, and at the same time, the modification reset signal line XL can transmit the modification reset voltage V1 to the pixel driving circuits in the first row. These two do not interfere with each other.

A difference between the pixel driving circuit 001 shown in FIG. 7 and the pixel driving circuit 001 shown in FIG. 1 is that the first reset module 03 includes a first reset sub-module 3A and a second reset sub-module 3B; an input terminal 3A1 of the first reset sub-module 3A is electrically connected to the third reset signal line SL3 that transmits the first reset voltage Vref1, an output terminal 3A2 of the first reset sub-module 3A is electrically connected to the first electrode 21 of the light-emitting module 02, and a control terminal 3A3 of the first reset sub-module 3A is electrically connected to the first scanning line S1; an input terminal 3B1 of the second reset sub-module 3B is electrically connected to the modification reset signal line XL that transmits the modification reset voltage V1, an output terminal 3B2 of the second reset sub-module 3B is electrically connected to the first electrode 21 of the light-emitting module 02, and a control terminal 3B3 of the second reset sub-module 3B is electrically connected to a second scanning line S2. The control terminal of the data voltage writing module 05 and the control terminal of the threshold compensation module 06 can be both electrically connected to the first scanning line S1.

Compared with the timing sequence shown in FIG. 5, the changes of the timing sequence corresponding to the pixel driving circuit 001 shown in FIG. 9 are as follows.

During the second reset sub-stage E12 of the first light-emitting stage T1, the first scanning line S1 transmits a turn-on signal to control the first reset sub-module 3A to be turned on, and the second scanning line S2 transmits a turn-off signal to control the second reset sub-module 3B to be turned off. Meanwhile, the third reset signal line SL3 transmits the first reset voltage Vref1, and the first reset voltage Vref1 is transmitted to the first electrode 21 of the light-emitting module 02 through the turned-on first reset sub-module 3A.

During the reset stage F1 of the second light-emitting stage T2, the first scanning line S1 transmits a turn-off signal to control the first reset sub-module 3A to be turned off, and the second scanning line S2 transmits a turn-on signal to control the second reset sub-module 3B to be turned on. Meanwhile, the modification reset signal line XL transmits the modification reset voltage V1, and the modification reset voltage V1 is transmitted to the first electrode 21 of the light-emitting module 02 through the turned-on second reset sub-module 3B.

For example, with reference to FIG. 8 and FIG. 9, the first reset sub-module 3A includes a first transistor M1, a source of the first transistor M1 is electrically connected to the third reset signal line SL3, a drain of the first transistor M1 is electrically connected to the first electrode 21 of the light-emitting module 02, and a gate of the first transistor M1 is electrically connected to the first scanning line S1. The second reset sub-module 3B includes a second transistor M2, a source of the second transistor M2 is electrically connected to the modification reset signal line XL, a drain of the second transistor M2 is electrically connected to the first electrode 21 of the light-emitting module 02, and a gate of the second transistor M2 is electrically connected to the second scanning line S2.

In an example, the first transistor M1 and the second transistor M2 are P-type transistors. The embodiments of the present disclosure will be described in the following by taking this example. It will be understood that in other examples, any one of the first transistor M1 and the second transistor M2 can also be an N-type transistor.

During the second reset sub-stage E12 of the first light-emitting stage T1, the first scanning line S1 transmits a low-level signal, i.e., a turn-on signal, and the first transistor M1 is turned on; and the second scanning line S2 transmits a high-level signal, i.e., a turn-off signal, and the second transistor M2 is turned off. At the same time, the third reset signal line SL3 transmits the first reset voltage Vref1, and the first reset voltage Vref1 is transmitted to the first electrode 21 of the light-emitting module 02 through the turned-on first transistor M1.

During the reset stage F1 of the second light-emitting stage T2, the first scanning line S1 transmits a high-level signal, i.e., a turn-off signal, and the first transistor M1 is turned off; and the second scanning line S2 transmits a low-level signal, i.e., a turn-on signal, and the second transistor M2 is turned on. At the same time, the modification reset signal line XL transmits the modification reset voltage V1, and the modification reset voltage V1 is transmitted to the first electrode 21 of the light-emitting module 02 through the turned-on second transistor M2.

Figure 10:
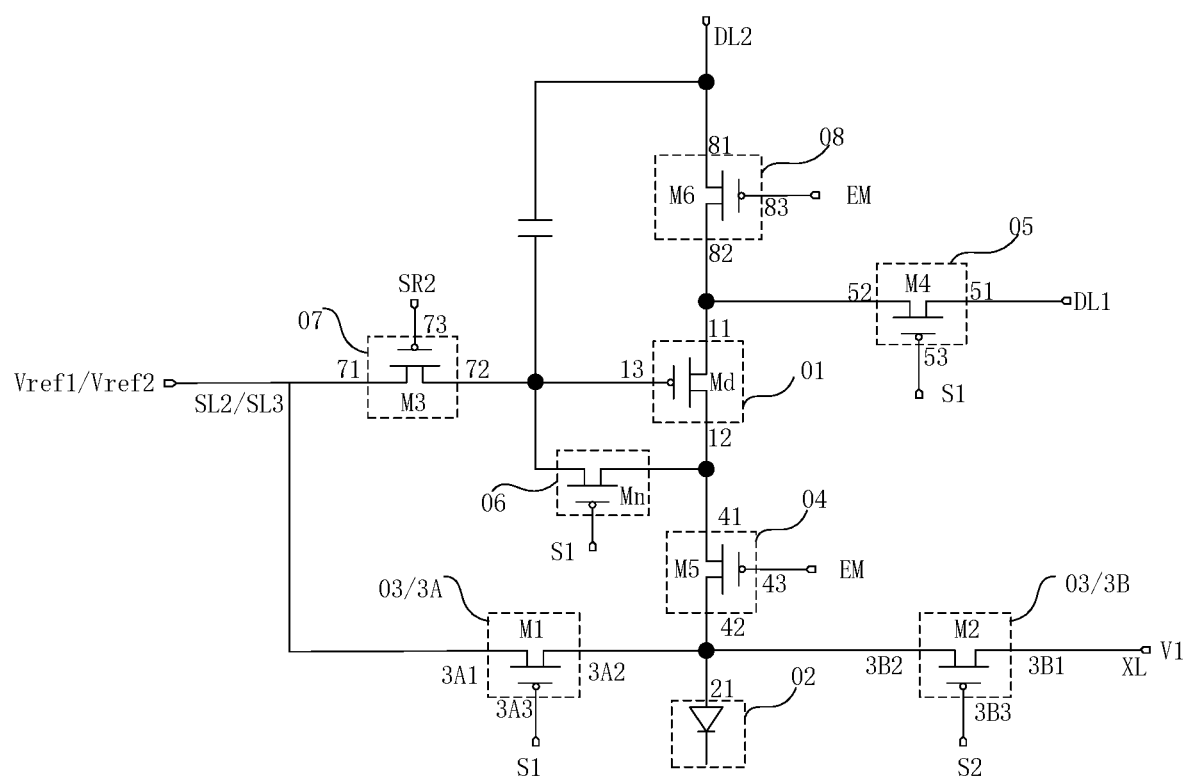
FIG. 10 is a schematic diagram of another pixel driving circuit provided by some embodiments of the present disclosure.

FIG. 10 is a schematic diagram of another pixel driving circuit provided by some embodiments of the present disclosure.

In some embodiments of the present disclosure, as shown in FIG. 10, the third reset voltage signal line SL3 can be reused as the second reset voltage signal line SL2, and the first reset voltage Vref1 can be reused as the second reset voltage Vref2. That is, the first reset voltage Vref1 and the second reset voltage Vref2 can have a same potential.

The embodiments of the present disclosure are beneficial to reduce the number of signal lines in the display panel, and because the potential of the first reset voltage Vref1 and the potential of the second reset voltage Vref2 can be the same, it is beneficial to reduce power consumption of the display panel.

Figure 11:
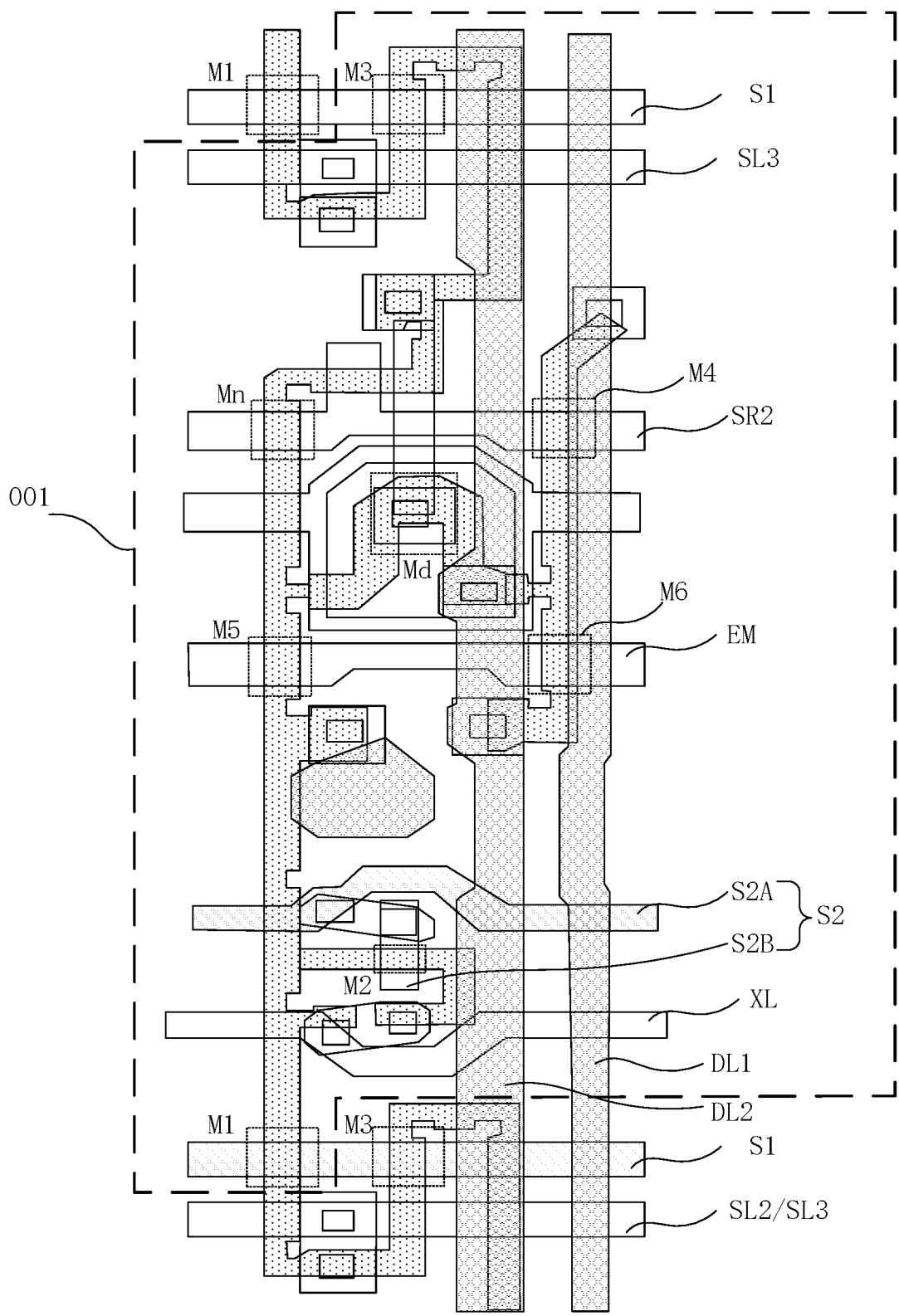
FIG. 11 is a schematic layout diagram of the pixel driving circuit shown in FIG. 10, according to an embodiment of the present disclosure.

FIG. 11 is a schematic layout diagram of the pixel driving circuit shown in FIG. 10.

As shown in FIG. 10 and FIG. 11, in some embodiments of the present disclosure, the first reset sub-module 3A includes a first transistor M1, and a gate of the first transistor M1 is electrically connected to the first scanning line S1; and the second reset sub-module 3B includes a second transistor M2, and a gate of the second transistor M2 is electrically connected to the second scanning line S2.

The second scanning line S2 is located between the first scanning line S1 and the driving module 02, that is, the second scanning line S2 is located between the first scanning line S1 and the driving transistor Md. Since a semiconductor layer of the first transistor M1 and a semiconductor layer of the second transistor M2 are connected to each other, the embodiments of the present disclosure are beneficial to reduce a degree of bending of the semiconductor layer in the pixel driving circuit 001 and facilitate the fabrication.

In some embodiments, the second scanning line S2 includes a first part S2A and a second part S2B that are electrically connected to each other, and the first part S2A covers a channel of the second transistor M2. Then, a part of the first part S2A that covers the channel of the second transistor M2 can be used as the gate of the second transistor M2.

In some embodiments, the first part S2A and the first scanning line S1 are arranged in a same layer, and at the same time, in order to avoid that the second scanning line S2 and the channels of other transistors except the second transistor M2 overlap, the second part S2B of the second scanning line S2 is disposed in a different layer from the first scanning line S1, and the second part S2B can be connected to the first part S2A via a through hole.

In some embodiments, the second part S2B and the first scanning line S1 can extend in a same direction.

Figure 12:
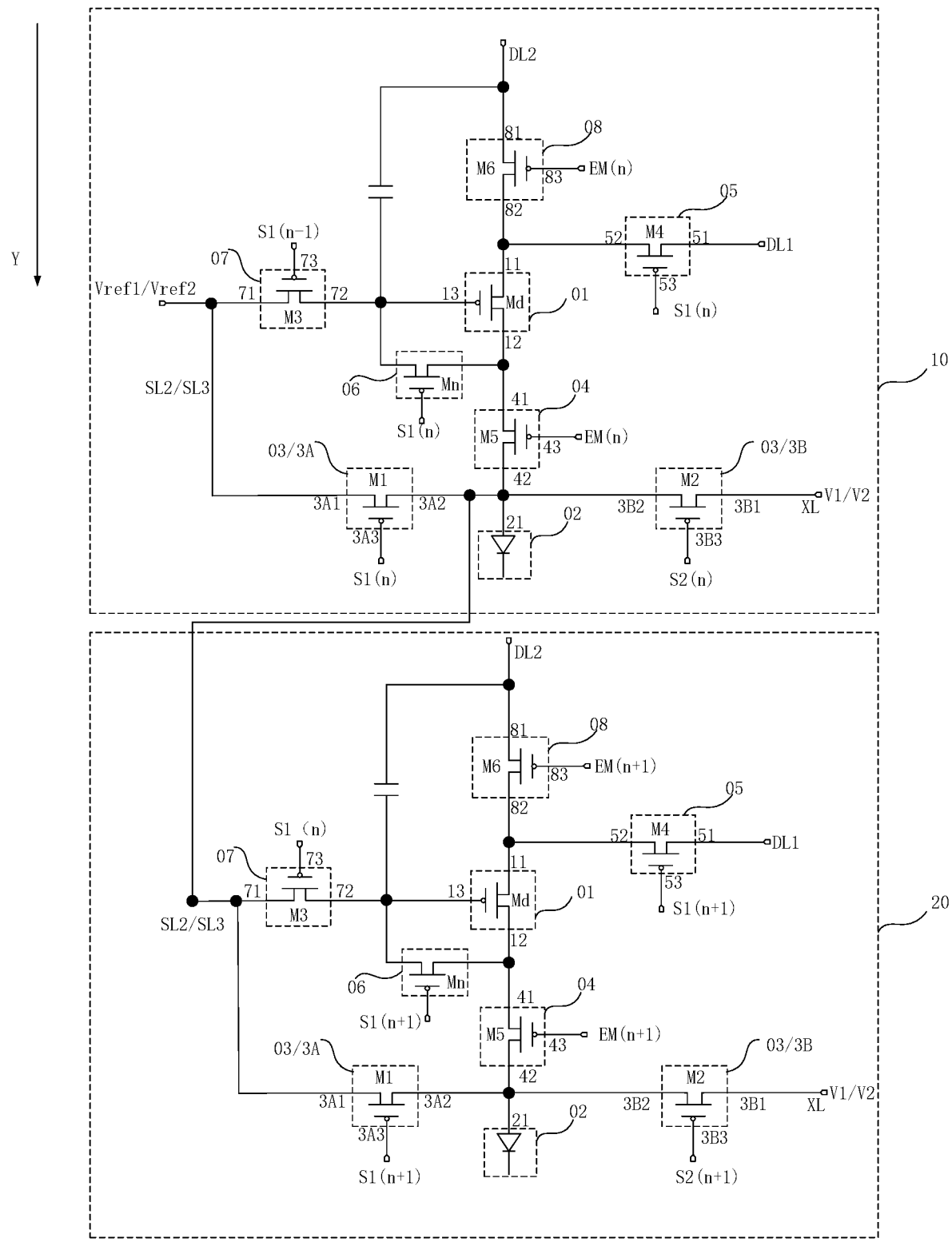
FIG. 12 is a schematic diagram of still another pixel driving circuit provided by some embodiments of the present disclosure.
Figure 13:
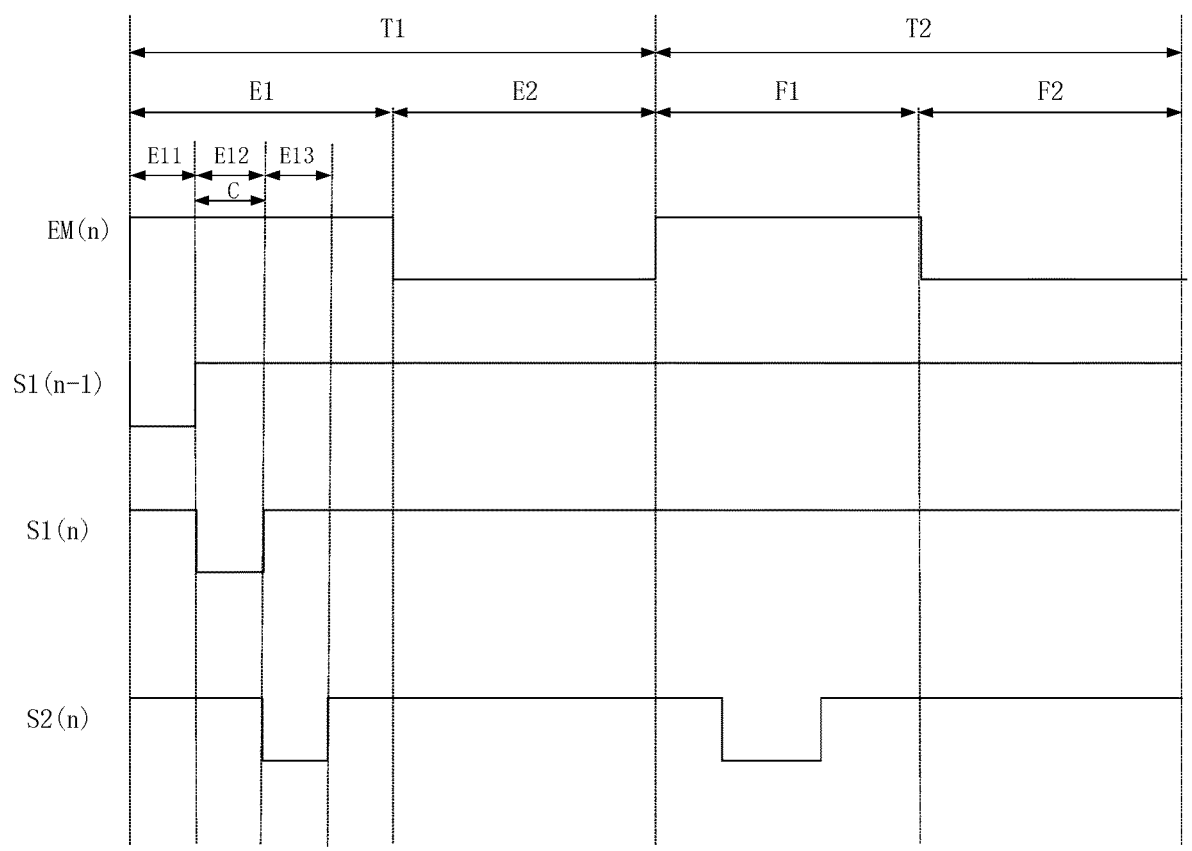
FIG. 13 is a working timing sequence of the pixel driving circuit shown in FIG. 12, according to an embodiment of the present disclosure.

FIG. 12 is a schematic diagram of another pixel driving circuit provided by some embodiments of the present disclosure, and FIG. 13 is a working timing sequence of the pixel driving circuit shown in FIG. 12.

In some embodiments of the present disclosure, as shown in FIG. 12, multiple pixel driving circuits 001 arranged along a first direction Y include a first pixel driving circuit 10 and a second pixel driving circuit 20. The first light-emitting stage T1 of the first pixel driving circuit 10 is prior to the first light-emitting stage T1 of the second pixel driving circuit 20. The first pixel driving circuit 10 can be the pixel driving circuit 001 in the first row of the display panel, and the second pixel driving circuit 20 can be the pixel driving circuit 001 corresponding to the first pixel driving circuit 10 and located in the second row of the display panel. The first pixel driving circuit 10 and the second pixel driving circuit 20 can share a same data signal line DL.

The input terminal 71 of the second reset module 07 in the second pixel driving circuit 20 is electrically connected to the output terminal 3A2 of the first reset sub-module 3A in the first pixel driving circuit 10. That is, the first reset voltage Vref1 transmitted by the first reset sub-module 3A in the first pixel driving circuit 10 can be used as the second reset voltage Vref2 transmitted by the second reset module 07 in the second pixel driving circuit 20, which is beneficial to reduce the number of signal lines in the displays panel.

The reset stage E1 of the first light-emitting stage T1 includes a first reset sub-stage E11 and a second reset sub-stage E12 after the first reset sub-stage E11. During the first reset sub-stage E11 of the first light-emitting stage T1, the second reset module 07 writes the second reset voltage Vref2 to the control terminal 13 of the driving module 01. During the second reset sub-stage E12 of the first light-emitting stage T1, the first reset sub-module 3A writes the first reset voltage Vref1 to the first electrode 21 of the light-emitting module 02.

The first reset sub-stage E11 of the second pixel driving circuit 20 and the second reset sub-stage E12 of the first pixel driving circuit 10 overlap in timing sequence, and the second reset voltage Vref2 is the same as the first reset voltage Vref1.

In some embodiments of the present disclosure, when the first pixel driving circuit 10 enters the second reset sub-stage E12, the second pixel driving circuit 20 may enter the first reset sub-stage E11, and at this time, the first reset sub-module 3A in the first pixel driving circuit 10 transmits the first reset voltage Vref1 to the light-emitting module 02 while this voltage can be transmitted to the input terminal 71 of the second reset module 07 in the second pixel driving circuit 20. The second reset module 07 is turned on, and the first reset voltage Vref1 may serve as the second reset voltage Vref2 transmitted by the second reset module 07 in the second pixel driving circuit 20 to be transmitted to the control terminal 13 of the driving module 01 in the second pixel driving circuit 20.

In some embodiments, with reference to FIG. 12 and FIG. 13, the reset stage E1 of the first light-emitting stage T1 includes a third reset sub-stage E13 during which the second reset sub-module 3B transmits a second modification reset voltage V2 to the first electrode 21 of the light-emitting module 02. The second modification reset voltage V2 is lower than the first reset voltage Vref1 and greater than the modification reset voltage V1.

In these embodiments, the first reset voltage Vref1 can be set relatively high, then for the pixel driving circuit 001 in which the first reset voltage Vref1 serves as the second reset voltage Vref2, the threshold compensation effect of the driving transistor Md can be improved. At the same time, during the third reset sub-stage E13, the second reset sub-module 3B can be configured to transmit a relatively small second modification reset voltage V2 to the first electrode 21 of the light-emitting module 02, avoiding a situation where the display screen is not dark in a dark state, and thus ensuring the contrast of the display screen.

In some embodiments of the present disclosure, with continued reference to FIG. 12, in a same pixel driving circuit 001, the control terminal 53 of the data voltage writing module 05 and the control terminal 3A3 of the first reset sub-module 3A are electrically connected to a same first scanning line S1, and the first scanning line S1 transmits a signal that controls the data voltage writing module 05 and the first reset sub-module 3A to be both turned on or both turned off.

The control terminal 3A3 of the first reset sub-module 3A in the first pixel driving circuit 10 and the control terminal 73 of the second reset module 07 in the second pixel driving circuit 20 are electrically connected to a same first scanning line S1, and a signal transmitted by the first scanning line S1 controls the first reset sub-module 3A in the first pixel driving circuit 10 and the second reset module 07 in the second pixel driving circuit 20 to be both turned on or both turned off.

That is, a signal transmitted by the first scanning line S1 controls the data voltage writing module 05 and the first reset sub-module 3A in a same pixel driving circuit 001 to be both turned on or both turned off, and controls the first reset sub-module 3A and the second reset module 07 in another pixel driving circuit 001 electrically connected to the output terminal 3A2 of the first reset sub-module 3A to be both turned on or both turned off.

The embodiments of the present disclosure reduce the number of control signal lines in the pixel driving circuit 001, which is beneficial to reducing the wiring in a border area of the display panel, and simplifies the peripheral circuits configured to drive the pixel driving circuit 001 in the display panel. In this way, it is beneficial to achieve a narrow border of the display panel, reduce the difficulty in the design of the circuit layout of the display panel and the manufacture of the circuit board, and save the manufacture cost of the display panel.

With further reference to FIG. 12, in some embodiments of the present disclosure, the output terminal 52 of the data voltage writing module 05 is electrically connected to the input terminal 11 of the driving module 01. The pixel driving circuit 001 can include a threshold compensation transistor Mn, an input terminal of the threshold compensation transistor Mn is electrically connected to the output terminal 11 of the driving module 01, and an output terminal of the threshold compensation transistor Mn is electrically connected to the control terminal 13 of the driving module 01.

The first reset sub-module 3A includes a first transistor M1, an output terminal of the first transistor M1 is electrically connected to the output terminal 3A2 of the first reset sub-module 3A, an input terminal of the first transistor M1 is electrically connected to the input terminal 3A1 of the first reset sub-module 3A, and a control terminal of the first transistor M1 is electrically connected to the control terminal 3A3 of the first reset sub-module 3A.

The second reset module 07 includes a third transistor M3, an output terminal of the third transistor M3 is electrically connected to the output terminal 72 of the second reset module 07, an input terminal of the third transistor M3 is electrically connected to the input terminal 71 of the second reset module 07, and a control terminal of the third transistor M3 is electrically connected to the control terminal 73 of the second reset modules 07.

The threshold compensation transistor Mn and the third transistor M3 each can include a metal oxide active layer.

In an example, the metal oxide active layer can be an indium gallium zinc oxide (IGZO) active layer. Since the oxide semiconductor transistor has a low off-state leakage current, the threshold compensation transistor Mn and the third transistor M3 can reduce an influence of the leakage current on the stability of the potential of the control terminal 13 of the driving module 01, which is beneficial to realize the stability of low-frequency driving of the pixel driving circuit 001.

In some embodiments, the first transistor M1 can include a metal oxide active layer.

In some embodiments, the control terminal 73 of the second reset module 07 in the second pixel driving circuit 20 is electrically connected to the control terminal 3A3 of the first reset sub-module 3A and the control terminal of the threshold compensation transistor Mn in the first pixel driving circuit 10.

That is, the control terminal 3A3 of the first reset sub-module 3A and the control terminal of the threshold compensation transistor Mn in the first pixel driving circuit 10, and the control terminal 73 of the second reset module 07 in the second pixel driving circuit 20 can be connected to a same first scanning line 51, and a signal transmitted by the first scanning line S1 can control the first reset sub-module 3A and the threshold compensation transistor Mn in the first pixel driving circuit 10 and the second reset module 07 in the second pixel driving circuit 20 to be all turned off or all turned on.

Figure 14:
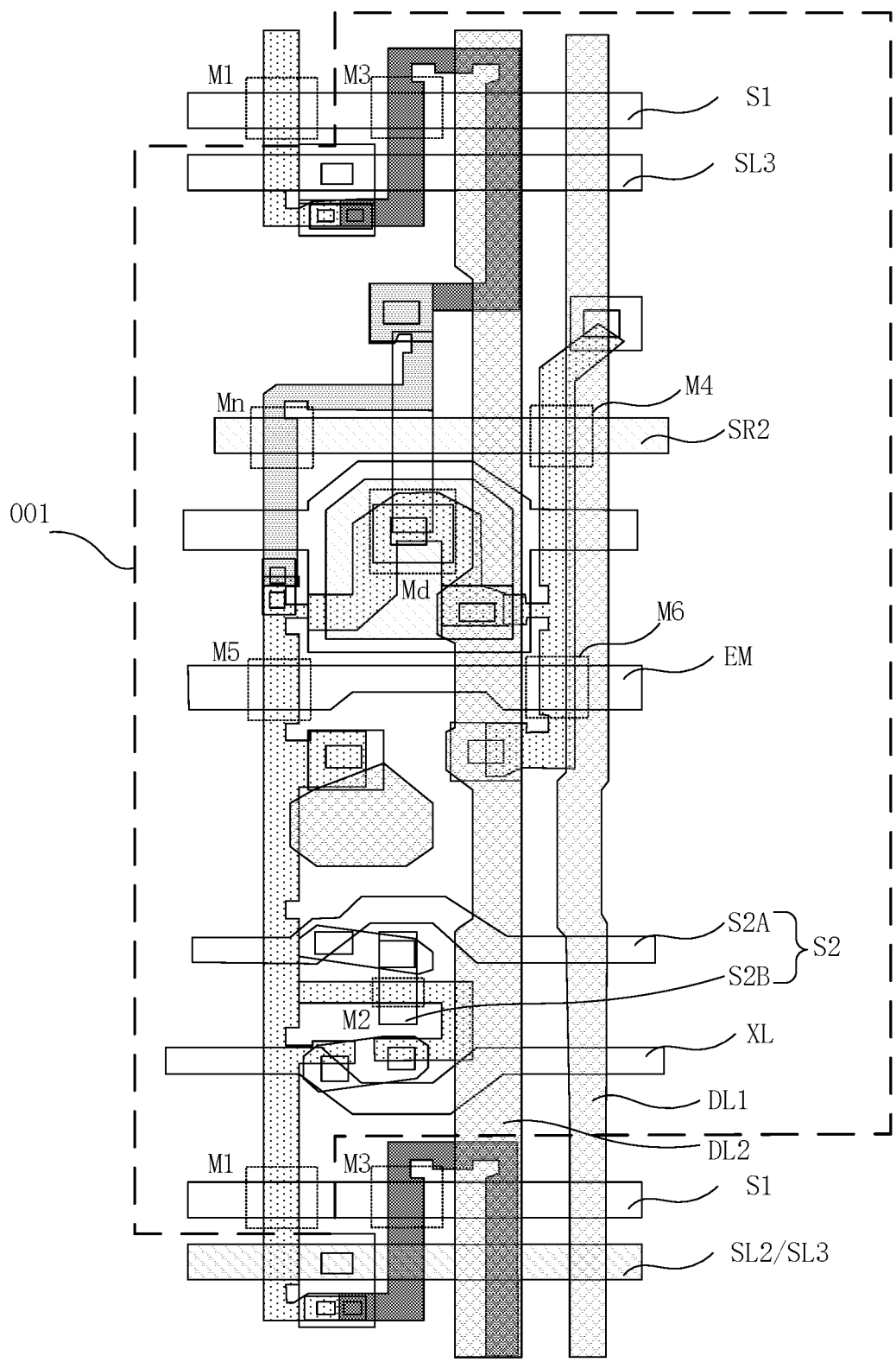
FIG. 14 is a schematic layout diagram of another pixel driving circuit provided by some embodiments of the present disclosure.

FIG. 14 is a schematic layout diagram of still another pixel driving circuit according to some embodiments of the present disclosure.

The difference between the layout of the pixel driving circuit shown in FIG. 14 and the layout of the pixel driving circuit shown in FIG. 11 is that a semiconductor layer of the third transistor M3 and a semiconductor layer of the threshold compensation transistor Mn include metal oxide. The threshold compensation transistor Mn is of a single-gate structure, and the metal oxide semiconductor layer is connected to, via a through hole, multiple polysilicon semiconductor layer that are connected to each other connected to each other.

It should be understood that, when the semiconductor layer of the threshold compensation transistor Mn is a polysilicon semiconductor layer, the threshold compensation transistor Mn can adopt a double-gate structure or a single-gate structure.

Embodiments of the present disclosure further provide a method for driving a pixel driving circuit, and is configured to drive the pixel driving circuit 001 provided in the above-mentioned embodiments. For the structure of the pixel driving circuit, reference can be made to the schematic diagrams in FIG. 1, FIG. 2, FIG. 4, FIG. 7, FIG. 8, or FIG. 12.

The pixel driving circuit 001 includes a driving module 01, a light-emitting module 02, and a first reset module 03. The driving module 01 is configured to generate a light-emitting driving current, and a first electrode 21 of the light-emitting module 02 is configured to receive the light-emitting driving current generated by the driving module 01. The light-emitting driving current generated by the driving module 01 drives the light-emitting module 02 to emit light. An output terminal 32 of the first reset module 03 is electrically connected to the first electrode 21 of the light-emitting module 02, and the first reset module 03 is configured to reset the first electrode 21 of the light-emitting module 02.

A working timing sequence of the pixel driving circuit 001 includes multiple working periods T, and the working period T includes a first light-emitting stage T1 and a second light-emitting stage T2 after the first light-emitting stage T1. The working timing sequence of the pixel driving circuit can be referred to the schematic diagrams shown in FIG. 2 and FIG. 6. The method for driving the pixel driving circuit can be understood in conjunction with the working process of the pixel driving circuit 001 in the above embodiments.

FIG. 15 is a flowchart of a method for driving a pixel driving circuit provided by some embodiments of the present disclosure.

As shown in FIG. 15, the method for driving the pixel driving circuit includes step S1 and step S2.

At step S1, during a reset stage E1 of a first light-emitting stage T1, the first reset module 03 transmits a first reset voltage Vref1 to the first electrode 21 of the light-emitting module 02.

At step S2, during a reset stage F1 of a second light-emitting stage T2, the first reset module 03 transmits a modification reset voltage V1 different from the first reset voltage Vref1 to the first electrode 21 of the light-emitting module 02.

In the method for driving the pixel driving circuit provided by the embodiments of the present disclosure, when the pixel driving circuit 001 is at operation during the reset stage F1 of the second light-emitting stage T2, the first reset module 03 is controlled to transmit the modification reset voltage V1 different from the first reset voltage Vref1 to the first electrode 21 of the light-emitting module 02, and a ramping speed of the current received by the light-emitting module 02 during the second light-emitting stage T2 is changed, that is, an influence caused by different bias states of the driving transistor Md during the second light-emitting stage T2 and during the first light-emitting stage T1 is avoided. Therefore, a difference between brightness of the light-emitting module 02 at the beginning of the first light-emitting stage T1 and brightness of the light-emitting module 02 at the beginning of the second light-emitting stage T2 is reduced, thereby weakening a flickering phenomenon of the display panel when displaying the image.

In some embodiments of the method for driving the pixel driving circuit, as shown in FIG. 1 and FIG. 2, the input terminal 31 of the first reset module 03 is electrically connected to the first reset signal line SL1, and the output terminal 32 of the first reset module 03 is electrically connected to the first electrode 21 of the light-emitting module 02. That is, the first reset module 03 transmits a signal transmitted by the first reset signal line SL1 to the first electrode 21 of the light-emitting module 02.

The method can include at step S1, during the reset stage E1 of the first light-emitting stage T1, turning on the first reset module 03 and transmitting the first reset voltage Vref1 by the first reset signal line SL1; and at step S2, during the reset stage F1 of the second light-emitting stage T2, turning on the first reset module 03 and transmitting the modification reset voltage V1 by the first reset signal line SL1.

In some embodiments of the method for driving the pixel driving circuit, as shown in FIG. 7 and FIG. 8, the first reset module 03 includes a first reset sub-module 3A and a second reset sub-module 3B.

An input terminal 3A1 of the first reset sub-module 3A is electrically connected to a third reset signal line SL3, and an output terminal 3A2 of the first reset sub-module 3A is electrically connected to the first electrode 21 of the light-emitting module 02.

An input terminal 3B1 of the second reset sub-module 3B is electrically connected to the modification reset signal line XL, and an output terminal 3B2 of the second reset sub-module 3B is electrically connected to the first electrode 21 of the light-emitting module 02.

The method for driving the pixel driving circuit includes: at step S1, during the reset stage E1 of the first light-emitting stage T1, turning on the first reset sub-module 3A and transmitting the first reset voltage Vref1 by the third reset signal line SL3; and at step S2, during the reset stage F1 of the second light-emitting stage T2, turning on the second reset sub-module 3B and transmitting the modification reset voltage V1 by the modification reset signal line XL.

Figure 16:
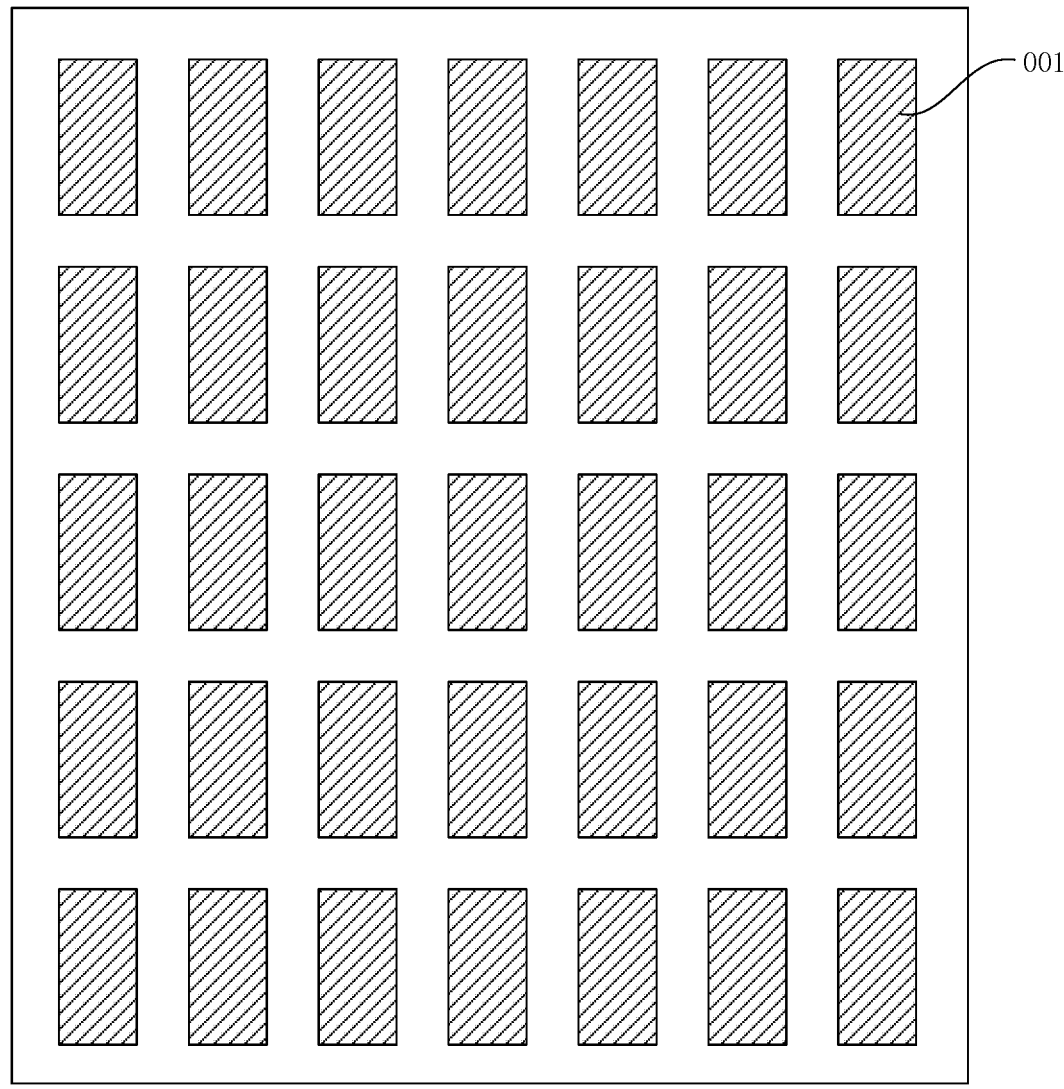
FIG. 16 is a schematic diagram of a display panel according to some embodiments of the present disclosure.

FIG. 16 is a schematic diagram of a display panel according to some embodiments of the present disclosure.

Some embodiments of the present disclosure provide a display panel 100. As shown in FIG. 16, the display panel 100 includes the pixel driving circuit 001 provided in the above embodiments. Multiple pixel driving circuits 001 can be arranged in an array along a row direction and a column direction in the display panel 100.

In the display panel 100, by transmitting the modification reset voltage V1 to the light-emitting module 02 during the reset stage F1 of the second light-emitting stage T2, a reset state of the light-emitting module 02 at the beginning of the light-emitting stage F2 of the second light-emitting stage T2 is changed. That is, by resetting the first electrode 21 of the light-emitting module 02, a ramping speed of the light-emitting driving current flowing through the light-emitting module 02 during the second light-emitting stage T2 is changed, thereby reducing a brightness difference of the display panel during the first light-emitting stage T1 and during the second light-emitting stage T1, and thus improving the display effect of the display panel.

Figure 17:
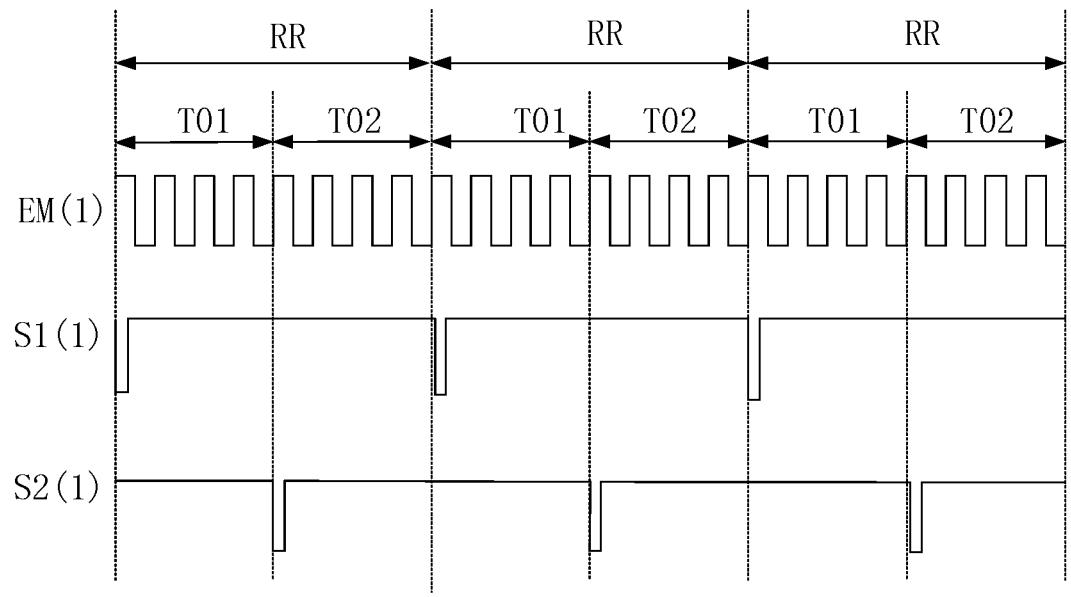
FIG. 17 is a working timing sequence of a display panel provided by some embodiments of the present disclosure.

FIG. 17 is a working timing sequence of a display panel according to some embodiments of the present disclosure.

In some embodiments of the present disclosure, an operation mode of the display panel 100 includes a first mode, as shown in FIG. 17, the first mode includes repeated first periods RR. The first period RR includes a first subframe T01 and a second subframe T02.

During the first subframe T01, the pixel driving circuits 001 in n rows of the display panel 100 sequentially enter the first light-emitting stage T1; and the pixel driving circuits 001 in the n rows of the display panel 100 sequentially then enter the second subframe T02 after completing the first light-emitting stage T1. During the second subframe T02, the pixel driving circuits 001 inn rows of the display panel 100 start sequentially enter the second light-emitting stage T2.

It should be understood that FIG. 17 is a schematic diagram illustrating only signals transmitted by the first scanning line S1(1) and the second scanning line S2(1) in the multiple rows of the pixel driving circuits 001 during the first period RR and is also a schematic diagram illustrating signals transmitted by the light-emitting control signal line EM(1) in a row of pixel driving circuits 001. In FIG. 17, the working timing sequence of the first scanning line S1(1) can reflect the working timing sequence of the first scanning line S1 connected to the pixel driving circuit 001 in any one row, the working timing sequence of the second scanning line S2(1) can reflect the working timing sequence of the second scanning line S2 connected to the pixel driving circuit 001 in any one row, and the working timing sequence of the light-emitting control signal line EM(1) can reflect the working timing sequence of the light-emitting control signal line EM connected to the pixel driving circuits 001 in any one row.

As shown in FIG. 17, in some embodiments, during a period from a moment when the pixel driving circuits 001 in a row start to enter the first light-emitting stage T1 to a moment when the pixel driving circuits 001 in this row complete the first light-emitting stage T1, the signal transmitted by the light-emitting control signal line EM controls the pixel driving circuit 001 to be turned on and turned off multiple times, that is, a frequency at which the light-emitting control signal line EM transmits a turn-on signal to the pixel driving circuit 001 is greater than 1; and during a period from a moment when the pixel driving circuits 001 in a row start to enter the second light-emitting stage T2 to a moment when the pixel driving circuits 001 in this row complete the second light-emitting stage T2, the signal transmitted by the light-emitting control signal line EM controls the pixel driving circuit 001 to be turned on and turned off multiple times, that is, a frequency at which the light-emitting control signal line EM transmits a turn-on signal to the pixel driving circuit 001 is greater than 1.

In some embodiments, as shown in FIG. 17, within a first period RR, the number of times the light-emitting control signal line EM transmits a turn-on signal to the pixel driving circuit 001 during the first light-emitting stage T1 is equal to the number of times the light-emitting control signal line EM transmits a turn-on signal to the pixel driving circuit 001 during the second light-emitting stage T2. That is, within a first period RR, the duration of the first subframe T01 is substantially the same as the duration of the second subframe T02. For example, within a first period RR, the duration of the first subframe T01 is $(1/120)$S and the duration of the first subframe T01 is also $(1/120)$S.

In some embodiments of the present disclosure, the second scanning line S2 can start to transmit a low-level signal sequentially at the beginning of the first subframe T01, that is, when a turn-on signal is transmitted, the first electrode 21 of the light-emitting module 02 is reset by the modification reset voltage V1. In this implementation manner, a frequency at which the second scanning line S2 transmits a turn-on signal can be the same as the frequency at which the first scanning line S1 transmits a turn-on signal.

Figure 18:
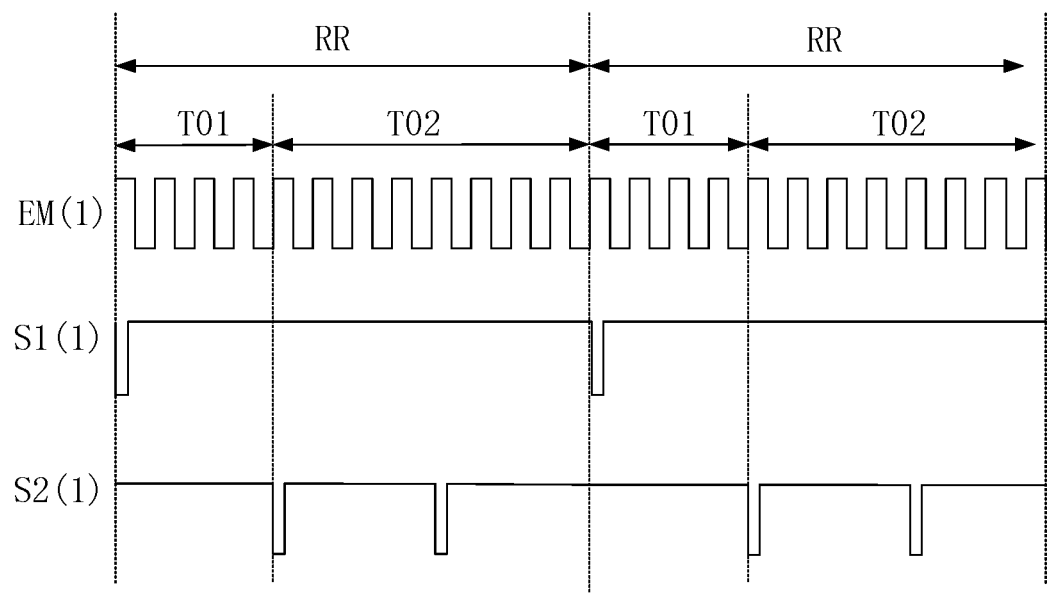
FIG. 18 is a working timing sequence of another display panel provided by some embodiments of the present disclosure.
Figure 19:
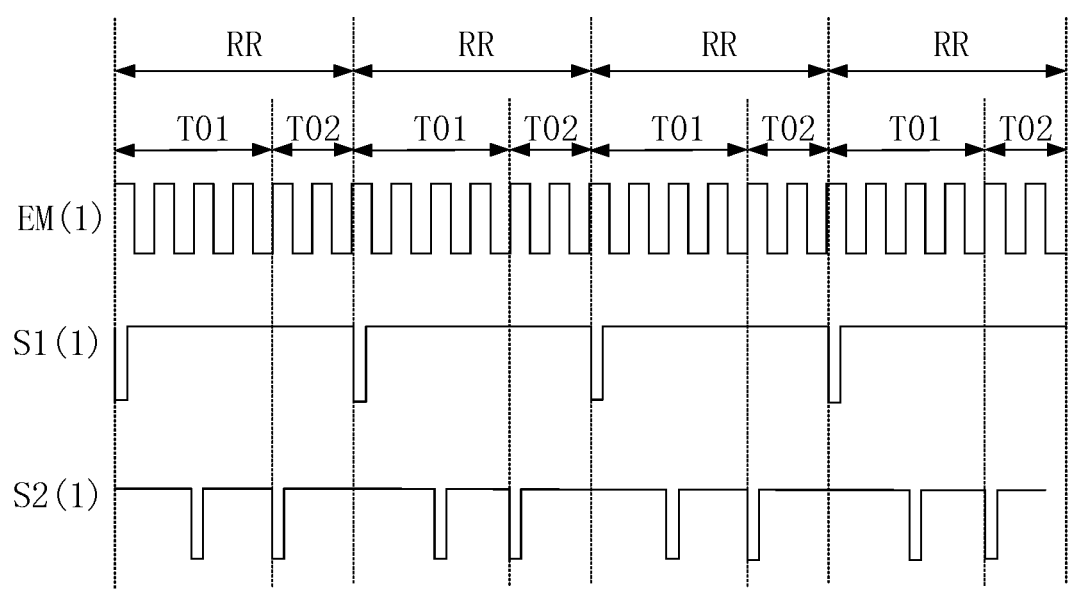
FIG. 19 is a working timing sequence of another display panel provided by some embodiments of the present disclosure.

FIG. 18 is a working timing sequence of another display panel provided by some embodiments of the disclosure, and FIG. 19 is a working timing sequence of another display panel provided by some embodiments of the disclosure.

In some embodiments of the present disclosure, as shown in FIG. 18 and FIG. 19, the operation mode of the display panel 100 can include a second mode, and the second mode also includes repeated first periods RR.

A difference between these embodiments and the previous embodiments is as follows. As shown in FIG. 18 and FIG. 19, within a first period RR, the number of times the light-emitting control signal line EM transmits a turn-on signal to the pixel driving circuit 001 during the first subframe T01 is not equal to the number of times the light-emitting control signal line EM transmits a turn-on signal to the pixel driving circuit 001 during the second subframe T02. That is, within a first period RR, the duration of the first subframe T01 is different from the duration of the second subframe T02.

In an embodiment, as shown in FIG. 18, within one working period RR, the duration of the second subframe T02 is longer than the duration of the first subframe T01. In some embodiments, within one working period RR, the duration of the second subframe T02 is an integer multiple of the duration of the first subframe T01. For example, within a first period RR, the duration of the first subframe T01 is ($\frac{1}{120}$)S and the duration of the second subframe T02 is ($\frac{1}{60}$)S.

In some embodiments, the second scanning lines S2 can start to transmit a low-level signal sequentially at the beginning of the second subframe T02, that is, when a turn-on signal is transmitted, the modification reset voltage V1 resets the first electrode 21 of the light-emitting module 02.

In some embodiments, a frequency at which the second scanning line S2 transmits a turn-on signal can be an integer multiple of a frequency at which the first scanning line S1 transmits a turn-on signal. In some embodiments, a ratio of the frequency of the second scanning line transmitting a turn-on signal to the frequency of the first scanning line S1 transmitting a turn-on signal is x, a ratio of the duration of the second subframe T02 to the duration of the first subframe T01 is y, and x=y.

In some embodiments, within one working period RR, the duration of the second subframe T02 is shorter than the duration of the first subframe T01. In some embodiments, within one working period RR, the duration of the first subframe T01 is equally divided into several durations of the second subframe T02. For example, within a first period RR, the duration of the first subframe T01 is ($\frac{1}{120}$)S and the duration of the second subframe T02 is ($\frac{1}{240}$)S.

In some embodiments, the second scanning lines S2 can start to transmit a low-level signal sequentially at the beginning of the first subframe T01, that is, when a turn-on signal is transmitted, the modification reset voltage V1 resets the first electrode 21 of the light-emitting module 02.

It should be understood that, although the second scanning line S2 transmits a turn-on signal during the first subframe T01, the pixel driving circuits 001 in a row electrically connected to the second scanning line S2 have completed the first light-emitting stage T1 at this time. For example, the second scanning line S2(1) transmits a turn-on signal during the first subframe T01, but the pixel driving circuit 001 electrically connected to the second scanning line S2(1) has completed the first light-emitting stage T1, and the display panel 100 is still within the first subframe T01 because the pixel driving circuit 001 electrically connected to the second scanning line S2 after the second scanning line S2(1) is still within the first light-emitting stage T1.

In some embodiments, a frequency at which the second scanning line S2 transmits a turn-on signal can be an integer multiple of a frequency at which the first scanning line S1 transmits a turn-on signal. In some embodiments, a ratio of the frequency at which the second scanning line transmits a turn-on signal to a frequency at which the first scanning line S1 transmits a turn-on signal is x, a ratio of the duration of the first subframe T01 to the duration of the second subframe T02 is z, and x=z.

In the embodiments, the first reset voltage Vref1 and the modification reset voltage V1 are transmitted by different signal lines, so the first reset voltage Vref1 and the modification reset voltage V1 can transmit signals to different pixel driving circuits 001 at the same time.

Figure 20:
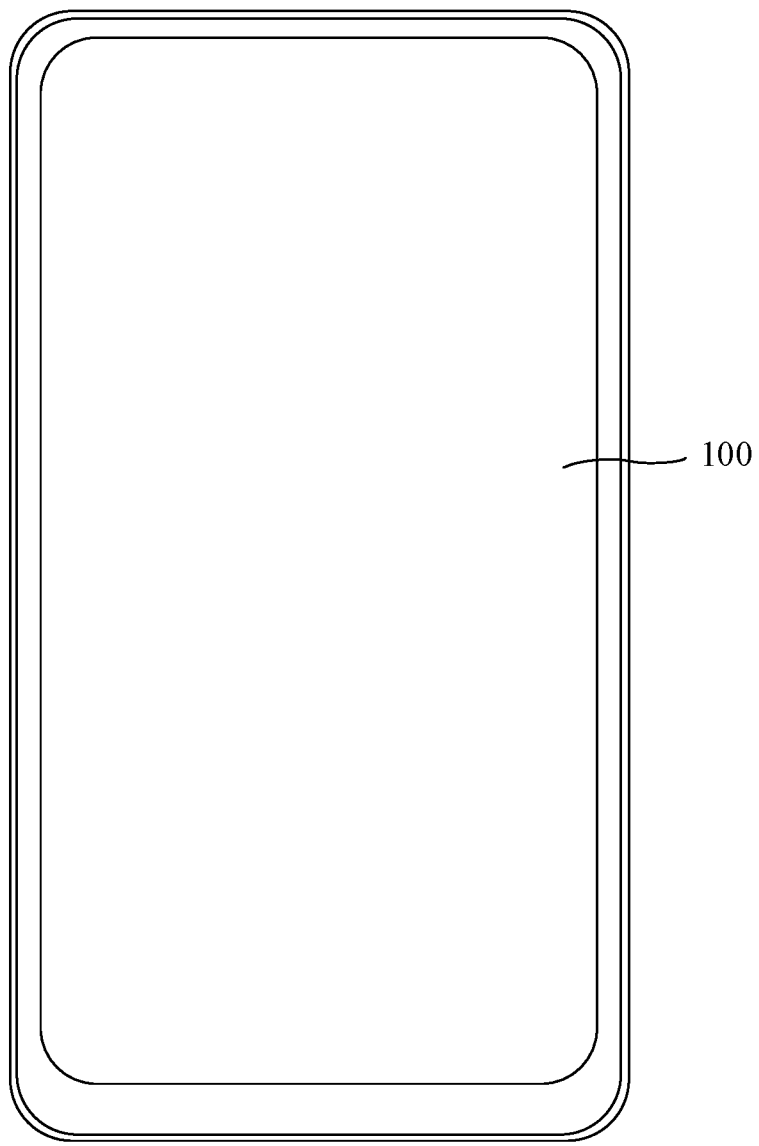
FIG. 20 is a schematic diagram of a display device provided by some embodiments of the present disclosure.

FIG. 20 is a schematic diagram of a display device according to some embodiments of the present disclosure.

As shown in FIG. 20, some embodiments of the present disclosure provide a display device 200, and the display device 200 includes the display panel 100 provided in the foregoing embodiments. The display device 200 provided by some embodiments of the present disclosure can be a mobile phone. In some embodiments, the display device 200 can also be a display device such as a computer and a TV.

In the display device 200, by transmitting the modification reset voltage V1 to the light-emitting module 02 during the reset stage F1 of the second light-emitting stage T2, a reset state of the light-emitting module 02 at the beginning of the light-emitting stage F2 of the second light-emitting stage T2 is changed. That is, by resetting the first electrode 21 of the light-emitting module 02, a ramping speed of the light-emitting driving current flowing through the light-emitting module 02 during the second light-emitting stage T2 is changed. Therefore, a brightness difference of the display panel during the first light-emitting stage T1 and during the second light-emitting stage T2 is reduced, thereby improving the display effect of the display panel.

The above are merely some embodiments of the present disclosure, which, as mentioned above, are not intended to limit the present disclosure. Within a principle of the present disclosure, any modification, equivalent substitution, improvement shall fall into the protection scope of the present disclosure.

What is claimed is:

1. A pixel driving circuit, comprising:
    a driving circuit configured to generate a light-emitting driving current;
    a light-emitting circuit comprising a first electrode configured to receive the light-emitting driving current generated by the driving circuit; and
    a first reset circuit comprising an output terminal electrically connected to the first electrode of the light-emitting circuit,
    wherein a working timing sequence of the pixel driving circuit comprises a plurality of working periods, wherein a working period of the plurality of working periods comprises a first light-emitting stage and a second light-emitting stage after the first light-emitting stage;
    wherein the first light-emitting stage comprises a reset stage and a light-emitting stage after the reset stage; and, during the reset stage of the first light-emitting stage, the first reset circuit transmits a first reset voltage to the first electrode of the light-emitting circuit; and
    wherein the second light-emitting stage comprises a reset stage and a light-emitting stage after the reset stage; and, during the reset stage of the second light-emitting stage, the first reset circuit transmits a modification reset voltage to the first electrode of the light-emitting circuit, the modification reset voltage being different from the first reset voltage.

2. The pixel driving circuit according to claim 1, further comprising a data voltage writing circuit electrically connected to the driving circuit and configured to provide a data voltage to a control terminal of the driving circuit,
    wherein the first light-emitting stage further comprises a data voltage writing stage, during which the data voltage writing circuit writes the data voltage to the control terminal of the driving circuit, and wherein the first electrode of the light-emitting circuit is an anode, and the modification reset voltage is lower than the first reset voltage.

3. The pixel driving circuit according to claim 2, further comprising a second reset circuit comprising an output terminal electrically connected to the control terminal of the driving circuit,
wherein, during the reset stage of the first light-emitting stage, the second reset circuit provides a second reset voltage to the control terminal of the driving circuit, the second reset voltage being different from the modification reset voltage.

4. The pixel driving circuit according to claim 3, wherein the first reset circuit comprises:
a first reset sub-circuit comprising an input terminal electrically connected to a third reset signal line and an output terminal electrically connected to the first electrode of the light-emitting circuit, and
a second reset sub-circuit comprising an input terminal electrically connected to a modification reset signal line and an output terminal electrically connected to the first electrode of the light-emitting circuit;
wherein, during the reset stage of the first light-emitting stage, the third reset signal line transmits the first reset voltage, and the first reset sub-circuit is turned on; and
wherein, during the reset stage of the second light-emitting stage, the modification reset signal line transmits the modification reset voltage, and the second reset sub-circuit is turned on.

5. The pixel driving circuit according to claim 4, wherein a plurality of pixel driving circuits arranged along a first direction comprise a first pixel driving circuit and a second pixel driving circuit; wherein the first light-emitting stage of the first pixel driving circuit is prior to the first light-emitting stage of the second pixel driving circuit; the input terminal of the second reset circuit of the second pixel driving circuit is electrically connected to the output terminal of the first reset sub-circuit of the first pixel driving circuit;
wherein the reset stage of the first light-emitting stage comprises a first reset sub-stage and a second reset sub-stage, the first reset sub-stage is prior to the second reset sub-stage; during the first reset sub-stage of the first light-emitting stage, the second reset circuit writes the second reset voltage to the control terminal of the driving circuit, during the second reset sub-stage of the first light-emitting stage, the first reset sub-circuit writes the first reset voltage to the first electrode of the light-emitting circuit; and
wherein the first reset sub-stage of the second pixel driving circuit and the second reset sub-stage of the first pixel driving circuit overlap in timing sequence, and the second reset voltage is the same as the first reset voltage.

6. The pixel driving circuit according to claim 5, wherein, in a pixel driving circuit of the plurality of pixel driving circuits, a control terminal of the data voltage writing circuit and a control terminal of the first reset sub-circuit are electrically connected to a same first scanning line, and a signal transmitted by the first scanning line controls the data voltage writing circuit and the first reset sub-circuit to be both turned on or both turned off; and
wherein the control terminal of the first reset sub-circuit in the first pixel driving circuit and the control terminal of the second reset circuit in the second pixel driving circuit are electrically connected to a same first scanning line, and a signal transmitted by the first scanning line controls the first reset sub-circuit in the first pixel driving circuit and the second reset circuit in the second pixel driving circuit to be both turned on or both turned off.

7. The pixel driving circuit according to claim 5, wherein a pixel driving circuit of the plurality of pixel driving circuits further comprises a threshold compensation transistor, wherein the threshold compensation transistor comprises an input terminal electrically connected to the output terminal of the driving circuit, and an output terminal electrically connected to the control terminal of the driving circuit;
wherein the first reset sub-circuit comprises a first transistor, wherein the first transistor comprises an output terminal electrically connected to the output terminal of the first reset sub-circuit, an input terminal electrically connected to the input terminal of the first reset sub-circuit, and a control terminal electrically connected to the control terminal of the first reset sub-circuit;
wherein the second reset circuit comprises a third transistor, wherein the third transistor comprises an output terminal electrically connected to the output terminal of the second reset circuit, an input terminal electrically connected to the input terminal of the second reset circuit, and a control terminal electrically connected to the control terminal of the second reset circuit; and
wherein the threshold compensation transistor, the first transistor, and the third transistor each comprise a metal oxide semiconductor layer; and the control terminal of the second reset circuit in the second pixel driving circuit is electrically connected to the control terminal of the first reset sub-circuit in the first pixel driving circuit and the control terminal of the threshold compensation transistor in the first pixel driving circuit.

8. The pixel driving circuit according to claim 4, wherein the first reset sub-circuit comprises a first transistor comprising a gate electrically connected to a first scanning line; and the second reset sub-circuit comprises a second transistor comprising a gate electrically connected to a second scanning line;
wherein the second scanning line is located between the first scanning line and the driving circuit,
wherein the second scanning line comprises a first part and a second part that are electrically connected to each other, and the first part covers a channel of the second transistor; and
wherein the first part and the first scanning line are arranged in a same layer, and the second part and the first scanning line are arranged in different layers.

9. The pixel driving circuit according to claim 8, wherein the second part and the first scanning line extend in a same direction.

10. The pixel driving circuit according to claim 3, wherein an input terminal of the first reset circuit is electrically connected to a first reset signal line, and the output terminal of the first reset circuit is electrically connected to the first electrode of the light-emitting circuit; and
wherein, during the reset stage of the first light-emitting stage, the first reset signal line transmits the first reset voltage; and during the reset stage of the second light-emitting stage, the first reset signal line transmits the modification reset voltage.

11. The pixel driving circuit according to claim 10, wherein the reset stage of the first light-emitting stage comprises a first reset sub-stage and a second reset sub-stage after the first reset sub-stage;

wherein, during the first reset sub-stage of the first light-emitting stage, the second reset circuit writes the second reset voltage to the control terminal of the driving circuit; and wherein, during the second reset sub-stage of the first light-emitting stage, the first reset circuit writes the first reset voltage to the first electrode of the light-emitting circuit.

12. The pixel driving circuit according to claim 11, wherein an input terminal of the second reset circuit is electrically connected to a second reset signal line;

wherein, during the first reset sub-stage of the first light-emitting stage, the second reset signal line transmits the second reset signal;

wherein, during the second reset sub-stage of the first light-emitting stage, the first reset signal line transmits the first reset signal, wherein the driving circuit comprises a driving transistor comprising a gate electrically connected to the output terminal of the second reset circuit; and wherein the driving transistor is a P-channel transistor, and the second reset voltage is greater than the first reset voltage.

13. The pixel driving circuit according to claim 3, wherein the driving circuit comprises a driving transistor comprising a gate electrically connected to the output terminal of the second reset circuit; and wherein the driving transistor is a P-channel transistor, and the second reset voltage is greater than the modification reset voltage.

14. The pixel driving circuit according to claim 2, wherein a difference between the modification reset voltage and the first reset voltage is greater than 1V.

15. The pixel driving circuit according to claim 1, further comprising a light-emitting control circuit comprising an input terminal electrically connected to an output terminal of the driving circuit; and an output terminal electrically connected to the first electrode of the light-emitting circuit;

wherein, during the reset stage of the first light-emitting stage and the reset stage of the second light-emitting stage, the light-emitting control circuit is turned off; and wherein, during the light-emitting stage of the first light-emitting stage and the light-emitting stage of the second light-emitting stage, the light-emitting control circuit is turned on.

16. The pixel driving circuit according to claim 1, wherein, during the reset stage of the first light-emitting stage, the first reset circuit transmits the first reset voltage to the first electrode of the light-emitting circuit for a duration of t1; during the reset stage of the second light-emitting stage, the first reset circuit transmits the modification reset voltage to the first electrode of the light-emitting circuit for a duration of t2; and t2>t1.

17. A method for driving a pixel driving circuit, wherein the pixel driving circuit comprises:

a driving circuit configured to generate a light-emitting driving current;

a light-emitting circuit comprising a first electrode configured to receive the light-emitting driving current generated by the driving circuit; and a first reset circuit comprising an output terminal electrically connected to the first electrode of the light-emitting circuit, wherein a working timing sequence of the pixel driving circuit comprises a plurality of working periods, wherein a working period of the plurality of working periods comprises a first light-emitting stage and a second light-emitting stage after the first light-emitting stage;

wherein the method comprises:

during a reset stage of the first light-emitting stage, transmitting, by the first reset circuit, a first reset voltage to the first electrode of the light-emitting circuit; and during a reset stage of the second light-emitting stage, transmitting, by the first reset circuit, a modification reset voltage different from the first reset voltage to the first electrode of the light-emitting circuit.

18. The method according to claim 17, wherein an input terminal of the first reset circuit is electrically connected to a first reset signal line, and the output terminal of the first reset circuit is electrically connected to the first electrode of the light-emitting circuit; and wherein the method further comprises:

during the reset stage of the first light-emitting stage, turning on the first reset circuit and transmitting the first reset voltage by the first reset signal line; and during the reset stage of the second light-emitting stage, turning on the first reset circuit and transmitting the modification reset voltage by the first reset signal line.

19. The method according to claim 18, wherein the first reset circuit comprises:

a first reset sub-circuit comprising an input terminal electrically connected to a third reset signal line and an output terminal electrically connected to the first electrode of the light-emitting circuit, and a second reset sub-circuit comprising an input terminal electrically connected to a modification reset signal line and an output terminal electrically connected to the first electrode of the light-emitting circuit; and wherein the method further comprises:

during the reset stage of the first light-emitting stage, turning on the first reset sub-circuit and transmitting the first reset voltage by the third reset signal line; and during the reset stage of the second light-emitting stage, turning on the second reset sub-circuit and transmitting the modification reset voltage by the modification reset signal line.

20. A display panel comprising:

a pixel driving circuit, wherein the pixel driving circuit comprises:

a driving circuit configured to generate a light-emitting driving current;

a light-emitting circuit comprising a first electrode configured to receive the light-emitting driving current generated by the driving circuit; and a first reset circuit comprising an output terminal electrically connected to the first electrode of the light-emitting circuit, wherein a working timing sequence of the pixel driving circuit comprises a plurality of working periods, wherein a working period of the plurality of working periods comprises a first light-emitting stage and a second light-emitting stage after the first light-emitting stage;

wherein the first light-emitting stage comprises a reset stage and a light-emitting stage after the reset stage; and during the reset stage of the first light-emitting stage, the first reset circuit transmits a first reset voltage to the first electrode of the light-emitting circuit; and wherein the second light-emitting stage comprises a reset stage and a light-emitting stage after the reset stage; and during the reset stage of the second light-emitting stage, the first reset circuit transmits a modification reset voltage to the first electrode of the light-emitting circuit, the modification reset voltage being different from the first reset voltage.

* * * * *